United States Patent
Takata et al.

(10) Patent No.: US 12,488,990 B2
(45) Date of Patent: Dec. 2, 2025

(54) ETCHING METHOD AND PLASMA PROCESSING APPARATUS

(71) Applicant: Tokyo Electron Limited, Tokyo (JP)

(72) Inventors: Fumiya Takata, Miyagi (JP); Shota Yoshimura, Miyagi (JP); Shinya Morikita, Miyagi (JP); Kota Oikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 381 days.

(21) Appl. No.: 17/856,251

(22) Filed: Jul. 1, 2022

(65) Prior Publication Data

US 2023/0005753 A1    Jan. 5, 2023

(30) Foreign Application Priority Data

Jul. 2, 2021 (JP) ................... 2021-110977
Nov. 19, 2021 (JP) ................... 2021-188752
May 24, 2022 (JP) ................... 2022-084554

(51) Int. Cl.
*H01L 21/311* (2006.01)
*H01J 37/32* (2006.01)
*H01L 21/02* (2006.01)

(52) U.S. Cl.
CPC .... *H01L 21/31116* (2013.01); *H01J 37/3244* (2013.01); *H01L 21/02126* (2013.01); *H01L 21/02219* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2016/0163558 A1* | 6/2016 | Hudson | H01L 21/31116 156/345.24 |
| 2018/0292756 A1* | 10/2018 | Kong | H01J 37/321 |
| 2019/0074191 A1* | 3/2019 | Nagatomo | H01L 21/31116 |
| 2020/0126804 A1* | 4/2020 | Dole | H01L 21/32133 |
| 2021/0159089 A1* | 5/2021 | Suda | H01L 21/32137 |
| 2022/0068610 A1* | 3/2022 | Schüngel | C23C 14/505 |
| 2023/0118701 A1* | 4/2023 | Tan | H01L 21/31144 438/723 |
| 2023/0268192 A1* | 8/2023 | Hudson | H01L 21/31116 438/710 |

FOREIGN PATENT DOCUMENTS

| | | |
|---|---|---|
| JP | H09-050984 A | 2/1997 |
| JP | 2019-207911 A | 12/2019 |
| TW | 200620420 A | 6/2006 |
| TW | 201631656 A | 9/2016 |

\* cited by examiner

*Primary Examiner* — Binh X Tran
(74) *Attorney, Agent, or Firm* — XSENSUS LLP

(57) ABSTRACT

An etching method includes: (a) providing a substrate including a first region containing silicon and nitrogen and a second region containing silicon and oxygen; (b) forming a tungsten-containing deposit on the first region using a first plasma generated from a first processing gas containing fluorine, tungsten, and at least one selected from a group consisting of carbon and hydrogen; and (c) after (b), etching the second region using a second plasma generated from a second processing gas different from the first processing gas.

16 Claims, 20 Drawing Sheets

ETCHING METHOD AND PLASMA PROCESSING APPARATUS

CROSS-REFERENCE TO RELATED APPLICATIONS

This application is based on and claims priority from Japanese Patent Application Nos. 2021-110977, 2021-188752, and 2022-084554, filed on Jul. 2, 2021, Nov. 19, 2021, and May 24, 2022, with the Japan Patent Office, the disclosures of which are incorporated herein in their entireties by reference.

TECHNICAL FIELD

The present disclosure relates to an etching method and a plasma processing apparatus.

BACKGROUND

Japanese Patent Laid-Open Publication No. H09-050984 discloses a method of etching an insulating film using a plasma. In the method, etching is performed while a conductive layer is formed on the surface of the insulating film during etching. A plasma generated from a mixed gas of $WF_6$ and $C_4F_8$ may be used for etching.

SUMMARY

According to an embodiment of the present disclosure, an etching method includes: (a) providing a substrate including a first region containing silicon and nitrogen and a second region containing silicon and oxygen; (b) forming a tungsten-containing deposit on the first region using a first plasma generated from a first processing gas containing fluorine, tungsten, and at least one selected from a group consisting of carbon and hydrogen; and (c) after (b), etching the second region using a second plasma generated from a second processing gas different from the first processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
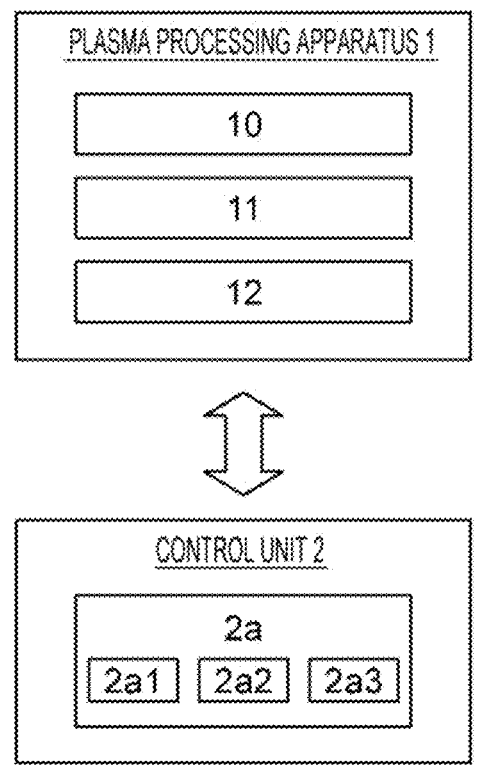
FIG. 1 is a view schematically illustrating a plasma processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

According to an embodiment of the present disclosure, an etching method includes: (a) providing a substrate including a first region containing silicon and nitrogen and a second region containing silicon and oxygen; (b) forming a tungsten-containing deposit on the first region using a first plasma generated from a first processing gas containing fluorine, tungsten, and at least one selected from a group consisting of carbon and hydrogen; and (c) after (b), etching the second region using a second plasma generated from a second processing gas different from the first processing gas.

According to the above-described etching method, a tungsten-containing deposit having excellent etching resistance may be formed when etching the second region.

The first processing gas may contain a tungsten-containing gas and at least one selected from a group consisting of a carbon-containing gas and a hydrogen-containing gas.

The tungsten-containing gas may include a tungsten hexafluoride gas.

The carbon-containing gas may contain at least one of $CH_4$ gas, $C_2H_2$ gas, $C_2H_4$ gas, $CH_3F$ gas, $CH_2F_2$ gas, $CHF_3$ gas, and CO gas.

The hydrogen-containing gas may contain at least one of $H_2$ gas, $SiH_4$ gas, and $NH_3$ gas.

In (a), the second region is provided to cover the first region, and the etching method may further include (d) etching the second region such that the first region is exposed after (a) and before (b).

In (b), the temperature of a substrate support that supports the substrate may be higher than 100° C. In this case, the etching resistance of the tungsten-containing deposit is further improved.

In (b) or after (b), a counter electrode containing silicon and facing the substrate support supporting the substrate may be sputtered. In this case, the etching resistance of the tungsten-containing deposit is further improved.

The first region may have a recess, and the second region may be embedded in the recess. In this case, the recess may be formed by etching the second region.

The above (c) may be performed in a self-aligned contact process.

A cycle including the above (b) and (c) may be repeated two or more times.

According to an embodiment of the present disclosure, an etching method includes: (a) providing a substrate that contains a silicon nitride having an exposed upper surface and a silicon oxide having an exposed upper surface; (b) forming a tungsten-containing deposit on the silicon nitride using a first plasma generated from a first processing gas containing a tungsten hexafluoride gas and at least one selected from a group consisting of a carbon-containing gas and a hydrogen-containing gas; and (c) after (b), etching the silicon oxide using a second plasma generated from a second processing gas different from the first processing gas.

According to an embodiment of the present disclosure, a plasma processing apparatus includes: a chamber; a substrate support configured to support a substrate in the chamber; a gas supply unit configured to supply a first processing gas and a second processing gas different from the first processing gas into the chamber; a plasma generation unit configured to generate a first plasma from the first processing gas in the chamber and a second plasma from the second processing gas in the chamber; and a control unit. The control unit is configured to execute a process including: (a) providing the substrate including a first region containing silicon and nitrogen and a second region containing silicon and oxygen; (b) forming a tungsten-containing deposit on the first region using a first plasma generated from a first processing gas containing fluorine, tungsten, and at least one selected from a group consisting of carbon and hydrogen; and (c) after (b), etching the second region using a second plasma generated from a second processing gas different from the first processing gas.

According to an embodiment of the present disclosure, an etching method includes: (a) providing a substrate including a first region containing silicon and nitrogen and a second region containing silicon and oxygen; (b) forming a carbon-containing deposit on the first region; (c) forming a tungsten-containing deposit on the carbon-containing deposit using a plasma generated from a processing gas containing fluorine and tungsten; and (d) after (c), etching the second region.

According to the above-described etching method, a total thickness of the carbon-containing deposit and the tungsten-containing deposit may be increased. Therefore, it is possible to form a deposit having excellent etching resistance.

The processing gas may contain a tungsten-containing gas, and the flow ratio of the tungsten-containing gas may be the largest among all gases contained in the processing gas except the inert gas.

In (c), an electric power for generating the plasma may be applied to the counter electrode facing the substrate support that supports the substrate. In this case, the collision of ions in the plasma with the substrate may be suppressed as compared with a case where an electric power for generating plasma is applied to the substrate support. Therefore, it is possible to suppress a decrease in the total thickness of the carbon-containing deposit and the tungsten-containing deposit.

Hereinafter, various embodiments will be described in detail with reference to the accompanying drawings. In each drawing, the same or corresponding parts are designated by the same reference numerals.

Figure 2:
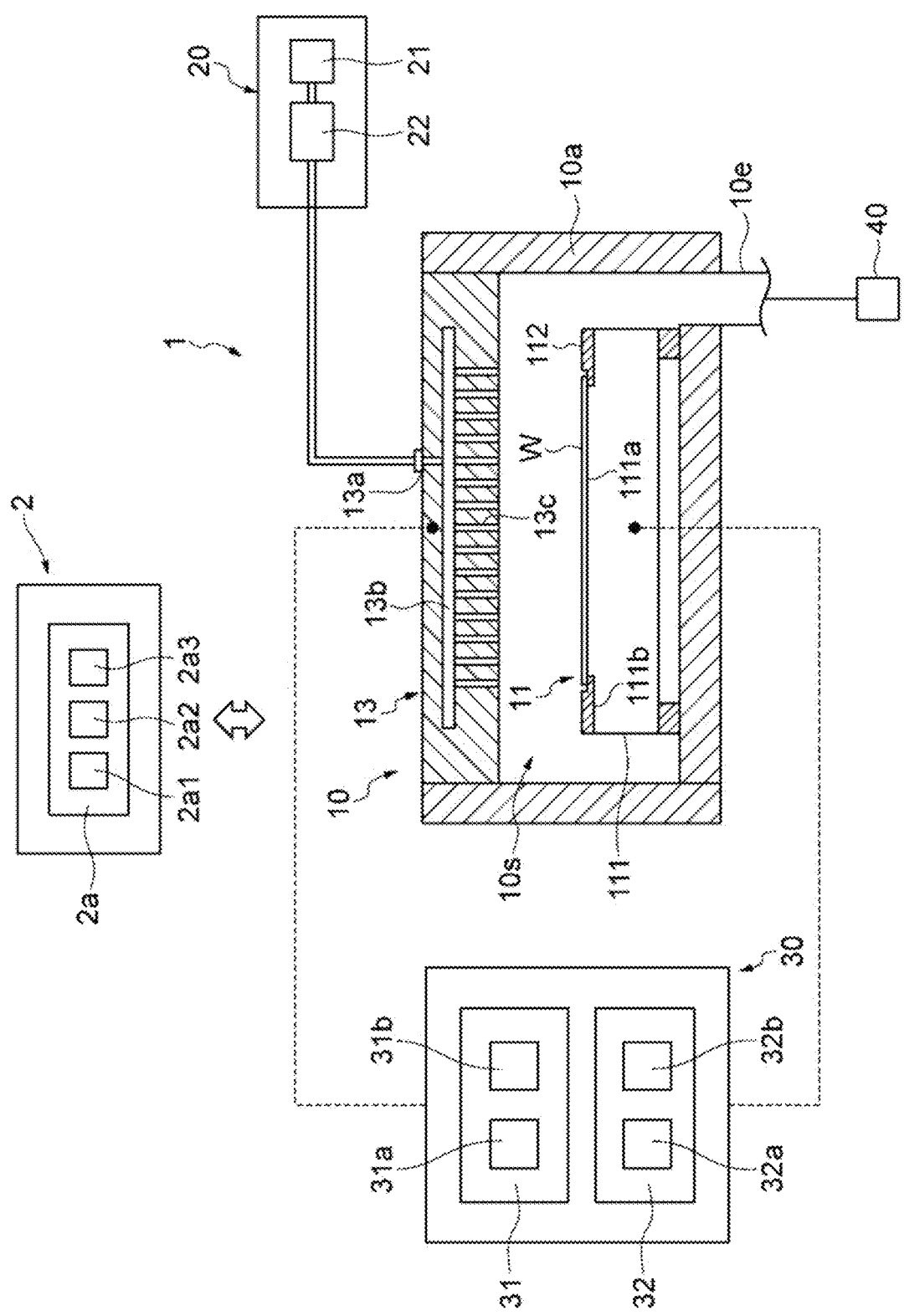
FIG. 2 is a view schematically illustrating a plasma processing apparatus according to the embodiment.

FIGS. 1 and 2 are views schematically illustrating a plasma processing apparatus according to an embodiment. According to the embodiment, a plasma processing system includes a plasma processing apparatus 1 and a control unit 2. The plasma processing apparatus 1 includes a plasma processing chamber 10, a substrate support unit 11, and a plasma generation unit 12. The plasma processing chamber 10 has a plasma processing space. Further, the plasma processing chamber 10 includes at least one gas supply port for supplying at least one processing gas to the plasma processing space, and at least one gas discharge port for discharging gas from the plasma processing space. The gas supply port is connected to a gas supply unit 20 (to be described later), and the gas discharge port is connected to an exhaust system 40 (to be described later). A substrate support unit 11 is disposed in the plasma processing space and has a substrate support surface for supporting a substrate.

The plasma generation unit 12 is configured to generate a plasma from at least one processing gas supplied into the plasma processing space. The plasma formed in the plasma processing space may be a capacitively-coupled plasma (CCP), an inductively-coupled plasma (ICP), an electron-cyclotron-resonance (ECR) plasma, a helicon wave plasma (HWP), or a surface wave plasma (SWP). Further, various types of plasma generation units including an alternating current (AC) plasma generation unit and a direct current (DC) plasma generation unit may be used. In the embodiment, the AC signal (AC power) used in the AC plasma generation unit has a frequency in the range of 100 kHz to 10 GHz. Therefore, the AC signal includes a radio-frequency (RF) signal and a microwave signal. In the embodiment, the RF signal has a frequency in the range of 200 kHz to 150 MHz.

The control unit 2 processes computer-executable instructions that cause the plasma processing apparatus 1 to perform the various steps described in the present disclosure. The control unit 2 may be configured to control each element of the plasma processing apparatus 1 to perform the various steps described herein. In the embodiment, a part of or all elements of the control unit 2 may be included in the plasma processing apparatus 1. The control unit 2 may include, for example, a computer 2a. The computer 2a may include, for example, a processing unit (central processing unit (CPU)) 2a1, a storage unit 2a2, and a communication interface 2a3. The processing unit 2a1 may be configured to perform various control operations based on the program stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

An example of the configuration of the plasma processing system will be described below.

The plasma processing system includes a capacitively-coupled plasma processing apparatus 1 and a control unit 2. The capacitively-coupled plasma processing apparatus 1 includes a plasma processing chamber 10, a gas supply unit 20, a power supply 30, and an exhaust system 40. Further, the plasma processing apparatus 1 includes a substrate support unit 11 and a gas introduction portion. The gas introduction unit is configured to introduce at least one processing gas into the plasma processing chamber 10. The gas introduction unit includes a shower head 13. The substrate support unit 11 is disposed in the plasma processing chamber 10. The shower head 13 is disposed above the substrate support unit 11. In the embodiment, the shower head 13 constitutes at least a part of the ceiling of the plasma processing chamber 10. The plasma processing chamber 10 includes a plasma processing space 10s defined by a shower head 13, a side wall 10a of the plasma processing chamber 10, and a substrate support unit 11. The plasma processing chamber 10 includes at least one gas supply port for supplying at least one processing gas to the plasma processing space, and at least one gas discharge port for discharging gas from the plasma processing space. The side wall 10a is grounded. The shower head 13 and the substrate support unit 11 are electrically insulated from the plasma processing chamber 10 housing.

The substrate support unit 11 includes a main body 11 and a ring assembly 112. The main body 111 has a central region (substrate support surface) 111a for supporting the substrate (wafer) W and an annular region (ring support surface) 111b for supporting the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 to surround the substrate W on the central region 111a of the main body 111. In the embodiment, the main body 111 includes a base and an electrostatic chuck. The main body 111 includes a conductive member. The conductive member of the main body 111 functions as an electrode. The electrostatic chuck is disposed on the base. The upper surface of the electrostatic chuck has a substrate support surface 111a. The ring assembly 112 includes one or more annular members. At least one of the one or more annular members is an edge ring. Although not illustrated, the substrate support unit 11 may include an electrostatic chuck, a ring assembly 112, and a temperature control module configured to adjust at least one of the substrates to the target temperature. The temperature control module may include a heater, a heat transfer medium, a flow path, or a combination thereof. Heat transfer fluids such as brine and gas flow through the flow path. Further, the substrate support unit 11 may include a heat transfer gas supply unit configured to supply a heat transfer gas between the back surface of the substrate W and the substrate support surface 111a.

The shower head 13 is configured to introduce at least one processing gas from the gas supply unit 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b and is introduced from the plurality of gas introduction ports 13c into the plasma processing space 10s. Further, the shower head 13 includes a conductive member. The conductive member of the shower head 13 faces the substrate support unit 11 and functions as an electrode (hereinafter, may be referred to as a counter electrode). The conductive member of the shower head 13 may contain a silicon-containing substance such as silicon. In addition to the shower head 13, the gas introduction portion may include one or a plurality of side gas injectors (SGI) attached to one or a plurality of openings formed in the side wall 10a.

The gas supply unit 20 may include at least one gas source 21 and at least one flow rate controller 22. In the embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. Further, the gas supply unit 20 may include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (RF power), such as a source RF signal and a bias RF signal, to the conductive member of the substrate support unit 11 and/or the conductive member of the shower head 13. As a result, a plasma is generated from one or more processing gases supplied to the plasma processing space 10s. Therefore, the RF power supply 31 may function as at least a part of a plasma generation unit configured to generate a plasma from one or more processing gases in the plasma processing chamber. Further, when the bias RF signal is supplied to the conductive member of the substrate support unit 11, a bias potential is generated in the substrate W, and the ionic component in the formed plasma may be drawn into the substrate W.

In the embodiment, the RF power supply includes a first RF generation unit 31a and a second RF generation unit 31b. The first RF generation unit 31a is configured to be coupled to the conductive member of the substrate support unit 11 and/or the conductive member of the shower head 13 via at least one impedance matching circuit, and generate a source RF signal (source RF power) for plasma generation. In the embodiment, the source RF signal has frequencies in the range of 13 MHz to 150 MHz. In the embodiment, the first RF generation unit 31a may be configured to generate multiple source RF signals having different frequencies. The generated one or more source RF signals are supplied to the conductive member of the substrate support unit 11 and/or the conductive member of the shower head 13. The second RF generation unit 31b is configured to be coupled to the conductive member of the substrate support unit 11 via at least one impedance matching circuit, and generate a bias RF signal (bias RF power). In the embodiment, the bias RF signal has a lower frequency than that of the source RF signal. In the embodiment, the bias RF signal has frequencies in the range of 400 kHz to 13.56 MHz. In the embodiment, the second RF generation unit 31a may be configured to generate multiple source RF signals having different frequencies. The generated one or more bias RF signals are supplied to the conductive member of the substrate support unit 11. Further, in various embodiments, at least one RF signal among the source RF signal and the bias RF signal may be pulsed.

Further, the power supply 30 may include a DC power supply 32 coupled to the plasma processing chamber 10. The DC power supply 32 includes a first DC generation unit 32a and a second DC generation unit 32b. In the embodiment, the first DC generation unit 32a is configured to be connected to the conductive member of the substrate support unit 11 and generate a first DC signal. The generated first DC signal is applied to the conductive member of the substrate support unit 11. In the embodiment, the first DC signal may be applied to another electrode, such as an electrode in an electrostatic chuck. In the embodiment, the second DC generation unit 32a is configured to be connected to the conductive member of the shower head 13 and generate a second DC signal. The generated second DC signal is applied to the conductive member of the shower head 13. In various embodiments, at least one of the first and second DC signals may be pulsed. The first and second DC generation units 32a and 32b may be provided in addition to the RF power supply 31, and the first DC generation unit 32a may be provided in place of the second RF generation unit 31b.

The exhaust system 40 may be connected to, for example, a gas outlet 10e provided at the bottom of the plasma processing chamber 10. The exhaust system 40 may include a pressure regulating valve and a vacuum pump. The pressure regulating valve adjusts the pressure in the plasma processing space 10s. The vacuum pump may include a turbo molecular pump, a dry pump, or a combination thereof.

Figure 3:
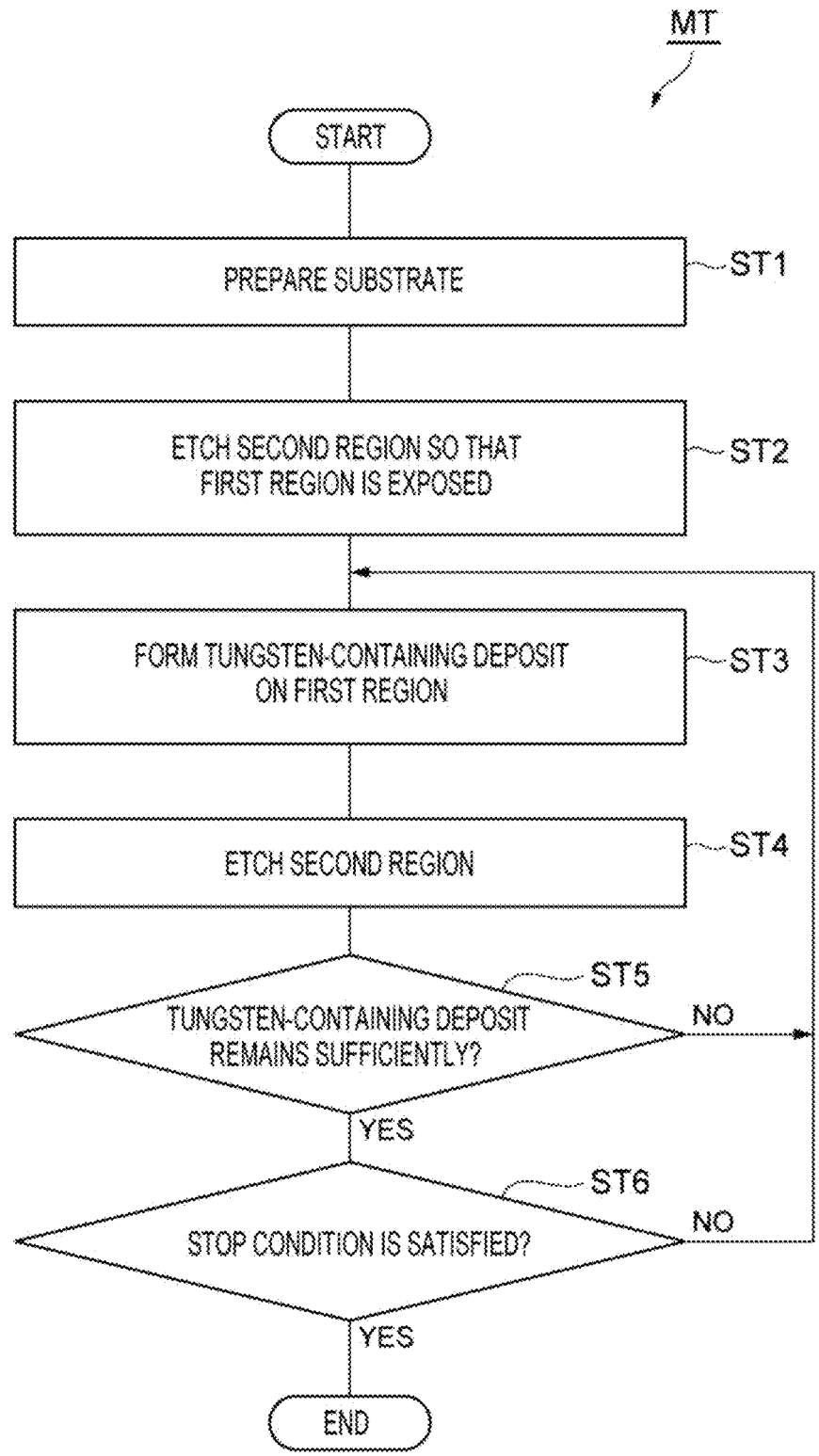
FIG. 3 is a flowchart of an etching method according to the embodiment.

FIG. 3 is a flowchart of an etching method according to the embodiment. The etching method MT (hereinafter, referred to as a "method MT") illustrated in FIG. 3 may be executed by the plasma processing apparatus 1 of the above-described embodiment. The method MT may be applied to the substrate W.

Figure 4:
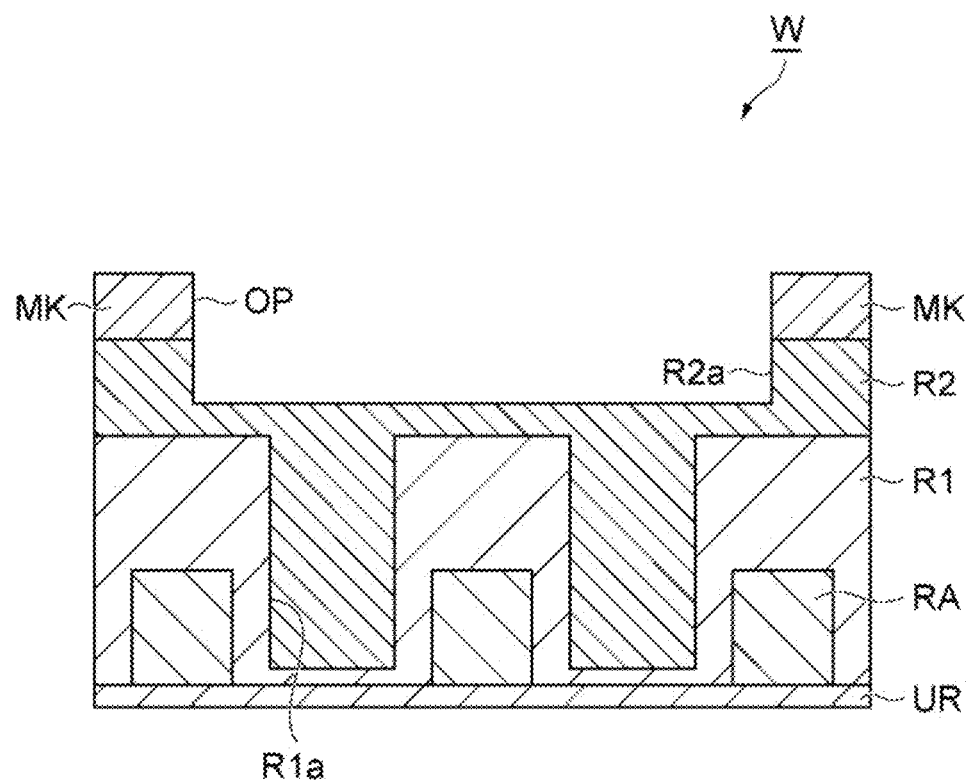
FIG. 4 is a partially enlarged cross-sectional view of a substrate to which the method of FIG. 3 may be applied.

FIG. 4 is a partially enlarged cross-sectional view of a substrate to which the method of FIG. 3 may be applied. As illustrated in FIG. 4, in the embodiment, the substrate W includes a first region R1 and a second region R2. The first region R1 may include at least one recess R1a. The first region R1 may include a plurality of recesses R1a. Each recess R1a may be a recess for forming a contact hole. The second region R2 may be embedded in the recess R1a. The second region R2 may be provided to cover the first region R1.

The first region R1 contains silicon and nitrogen. The first region R1 may contain silicon nitride ($SiN_x$). The first region R1 may be a region formed by, for example, CVD, or may be a region obtained by nitriding silicon. The first region R1 may include a first portion containing silicon nitride ($SiN_x$) and a second portion containing silicon carbide (SiC). In this case, the first portion has a recess R1a.

The second region R2 contains silicon and nitrogen. The second region R2 may contain silicon nitride ($SiO_x$). The second region R2 may be a region formed by, for example, CVD, or may be a region obtained by oxidizing silicon. The second region R2 may include a plurality of recesses R2a. The recess R2a has a larger width than the width of the recess R1a.

The substrate W may include an underlying region UR and at least one raised region RA provided on the underlying region UR. The underlying region UR and at least one raised region RA are covered by the first region R1. The underlying region UR may contain silicon. A plurality of raised regions RA is located on the underlying region UR. The recess R1a of the first region R1 is located between the plurality of raised regions RA. Each raised region RA may form a gate region of the transistor.

The substrate W may include a mask MK. The mask MK is provided on the second region R2. The mask MK may contain metal or silicon. The mask MK may include an opening OP. The opening OP corresponds to the recess R2a of the second region R2.

Figure 5:
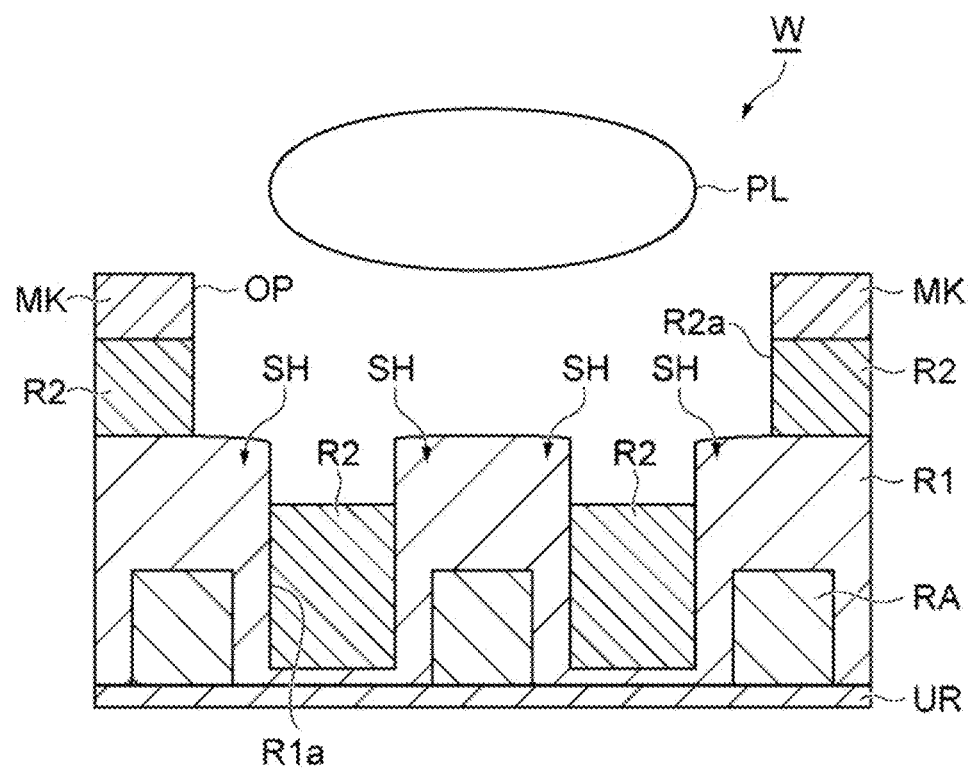
FIG. 5 is a cross-sectional view illustrating a process of the etching method according to the embodiment.
Figure 6:
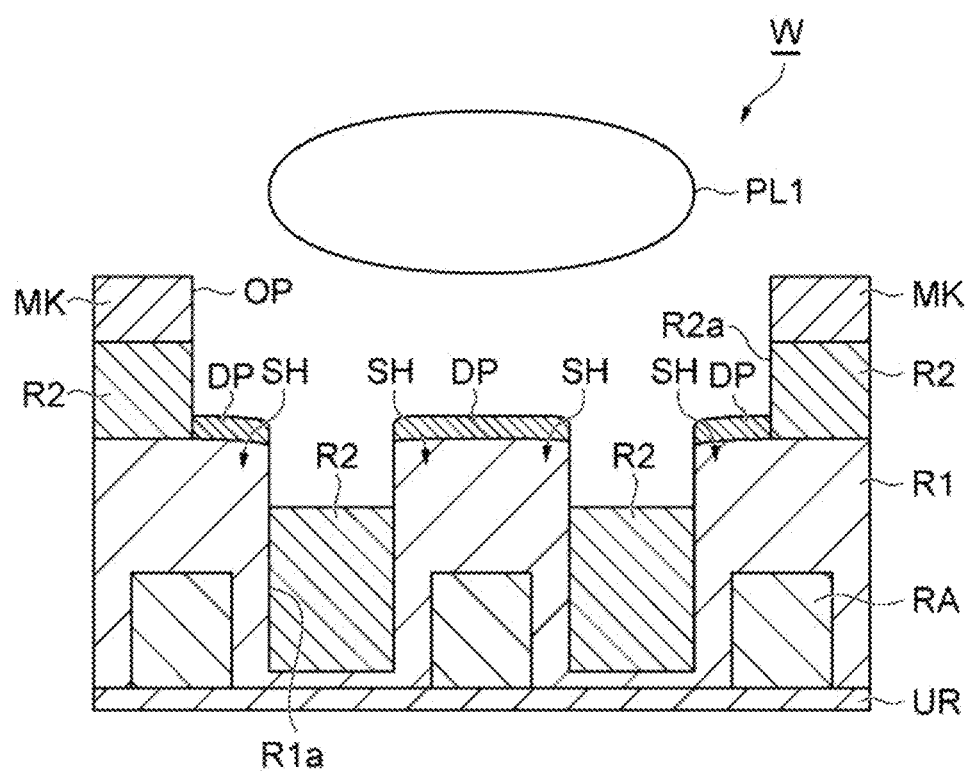
FIG. 6 is a cross-sectional view illustrating a process of the etching method according to the embodiment.
Figure 7:
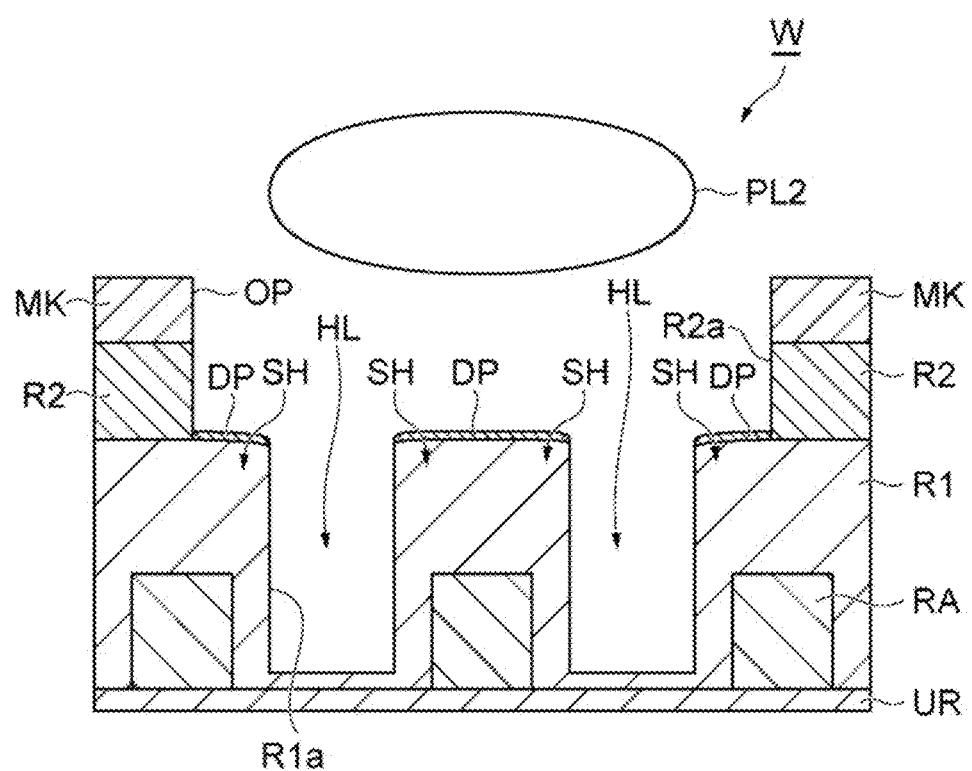
FIG. 7 is a cross-sectional view illustrating a process of the etching method according to the embodiment.

Hereinafter, the method MT will be described with reference to FIGS. 3 to 7 by taking the case where the method MT is applied to the substrate W by using the plasma processing apparatus 1 of the above-described embodiment as an example. FIGS. 5 to 7 are cross-sectional views illustrating a process of the etching method according to the embodiment. When the plasma processing apparatus 1 is used, the method MT may be executed in the plasma processing apparatus 1 by the control of each unit of the plasma processing apparatus 1 by the control unit 2. In the method MT, as illustrated in FIG. 2, the substrate W on the substrate support unit 11 (substrate support) disposed in the plasma processing chamber 10 is processed.

As illustrated in FIG. 3, the method MT may include step ST1, step ST2, step ST3, step ST4, step ST5, and step ST6. Steps ST1 to ST6 may be executed sequentially. The method MT may not include at least one of step ST2, step ST5, and step ST6. Step ST2 may be included in step ST1.

In step ST1, the substrate W illustrated in FIG. 4 is prepared. The substrate W may be supported by the substrate support unit 11 in the plasma processing chamber 10. The substrate W may have the shape illustrated in FIG. 4 as a result of plasma etching, or may have the shape illustrated in FIG. 4 from the time when the substrate W is provided to the plasma processing chamber 10. In step ST1, the second region R2 may be provided to cover the first region R1. In step ST1, the upper surface of the first region R1 and the upper surface of the second region R2 may be exposed. That is, in step ST1, the upper surface of silicon nitride and the upper surface of silicon oxide may be exposed.

In step ST2, as illustrated in FIG. 5, the second region R2 is etched so that the first region R1 is exposed. In step ST2, the first region R1 may also be etched. In particular, a shoulder portion SH in the recess R1a of the first region R1 may be etched. Etching is performed using, for example, a plasma PL generated from the processing gas. In an example, the processing gas contains a fluorine-containing gas and may contain tungsten. Further, in the example, the processing gas may contain tungsten immediately before the first region R1 is exposed. A mask MK is used for etching. Etching may be performed as follows. First, the gas supply unit 20 supplies the processing gas into the plasma processing chamber 10. Next, the plasma generation unit 12 generates the plasma PL from the processing gas in the plasma processing chamber 10. The control unit 2 controls the gas supply unit 20 and the plasma generation unit 12 so that the first region R1 is exposed and the second region R2 is etched. In step ST2, bias power may or may not be applied to the electrodes in the main body 111 of the substrate support unit 11. In particular, the bias power may not be applied immediately before and after the exposure of the first region R1. As a result, deposits are likely to be formed, and etching of the shoulder portion SH in the recess R1a is suppressed.

The fluorine-containing gas may contain carbon. The fluorine-containing gas may contain at least one of a fluorocarbon gas and a hydrofluorocarbon gas. The fluorocarbon ($C_xF_y$) gas may contain at least one of $CF_4$ gas, $C_3F_6$ gas, $C_3F_8$ gas, $C_4F_8$ gas, and $C_4F_6$ gas. The hydrofluorocarbon ($C_xH_yF_z$) gas may contain at least one of $CH_2F_2$ gas, $CHF_3$ gas, and $CH_3F$ gas.

In step ST2, the second region R2 containing silicon oxide is etched by the active species containing fluorine in the plasma PL.

In step ST3, as illustrated in FIG. 6, the first plasma PL1 generated from the first processing gas is used to form a tungsten-containing deposit DP on the first region R1. The tungsten-containing deposit DP may be a tungsten-containing film. When the first plasma PL1 is exposed to the first region R1 and the second region R2, the tungsten-containing deposit DP may be preferentially formed on the first region R1 as compared to the second region R2. The phrase "the tungsten-containing deposit DP may be preferentially formed on the first region R1 as compared to the second region R2" means that, for example, the thickness of the tungsten-containing deposit DP on the first region R1 is larger than the thickness of the tungsten-containing deposit DP on the second region R2, and more specifically, means that the thickness of the tungsten-containing deposit DP on the second region R2 is 50% or less of the thickness of the tungsten-containing deposit DP on the first region R1. Etching may be performed as follows. First, the gas supply unit 20 supplies the first processing gas into the plasma processing chamber 10. Next, the plasma generation unit 12 generates a first plasma PL1 from the first processing gas in the plasma processing chamber 10. The control unit 2 controls the gas supply unit 20 and the plasma generation unit 12 so that the tungsten-containing deposit DP is formed on the first region R1.

The first processing gas contains fluorine, tungsten, and at least one selected from a group consisting of carbon and hydrogen. The first processing gas may contain a tungsten-containing gas and at least one selected from a group consisting of a carbon-containing gas and a hydrogen-containing gas. Fluorine may be contained in a carbon-containing gas, a hydrogen-containing gas, or a tungsten-containing gas.

The carbon-containing gas may contain at least one of $CH_4$ gas, $C_2H_2$ gas, $C_2H_4$ gas, $CH_3$ gas, $CH_2F_2$ gas, $CHF_3$ gas, and CO gas.

The hydrogen-containing gas may contain at least one of $H_2$ gas, $SiH_4$ gas, and $NH_3$ gas.

The tungsten-containing gas may include a halogenated tungsten gas. The halogenated tungsten gas may contain at least one of tungsten hexafluoride ($WF_6$) gas, tungsten hexabromide ($WBr_6$) gas, tungsten hexachloride ($WCl_6$) gas, and $WF_5Cl$ gas. The tungsten-containing gas may contain hexacarbonyl tungsten ($W(CO)_6$) gas.

The first processing gas may contain a noble gas such as argon gas, helium gas, xenon gas, or neon gas. The first processing gas may contain, for example, nitrogen ($N_2$) gas.

The flow rate ratio of the tungsten-containing gas may be smaller than the flow rate ratio of at least one of the carbon-containing gas and the hydrogen-containing gas. The flow rate ratio of the noble gas may be larger than the flow rate ratio of at least one of the carbon-containing gas and the hydrogen-containing gas. In the present disclosure, the flow rate ratio of each gas is the ratio (volume %) of the flow rate of each gas to the total flow rate of the processing gas.

The duration of step ST3 may be 1 second or longer, or 10 seconds or longer. The duration of step ST3 may be 1,000 seconds or less, or may be 100 seconds or less.

In step ST3, the temperature of the substrate support unit 11 may be 50° C. or higher, 100° C. or higher, over 100° C., 120° C. or higher, 130° C. or higher, over 130° C., 140° C. or higher, or 150° C. or higher. Further, the temperature of the substrate support unit 11 may be 250° C. or lower, 220° C. or lower, or 200° C. or lower.

In step ST3, the pressure in the plasma processing chamber 10 may be 10 mTorr (1.3 Pa) or more. Further, the pressure in the plasma processing chamber 10 may be 100 mTorr (13 Pa) or less, or may be 50 mTorr (6.7 Pa) or less.

In step ST3, RF power may be applied to the counter electrode facing the substrate support unit 11. The RF power may be 100 W or more and 1,000 W or less, 200 W or more and 800 W or less, or 300 W or more and 500 W or less. The frequency of the RF power may be 27 MHz or more and 100 MHz or less.

In step ST3, bias power may or may not be applied to the electrodes in the main body 111 of the substrate support unit 11. The bias power applied to the electrodes in the main body 111 in step ST3 is smaller than the bias power applied to the electrodes in the main body 111 in step ST4, and may be less than 100 W.

In step ST3 or after step ST3, the counter electrode facing the substrate support unit 11 may be sputtered. The counter electrode contains silicon. A negative DC voltage may be applied to the counter electrode by the second DC generation unit 32b. The absolute value of the DC voltage applied to the counter electrode may be 100 V or more, or 1,000 V or less. For example, when the noble gas ion in the first plasma PL1 collides with the counter electrode, silicon is released into the first plasma PL1. The counter electrode may include an inner first electrode and an outer second electrode. The absolute value of the DC voltage applied to the first electrode may be larger than the absolute value of the DC voltage applied to the second electrode. When sputtering is performed after step ST3, sputtering may be performed using the plasma generated from a processing gas containing a noble gas.

The tungsten-containing deposit DP may contain carbon. The tungsten-containing deposit DP may contain tungsten carbide ($WC_x$). After step ST3, the maximum thickness of the tungsten-containing deposit DP may be 5 nm or more.

Without being bound by theory, the tungsten-containing deposit DP may be formed as follows. When carbon is contained in the first processing gas, the active species containing tungsten in the first plasma PL1 reacts with the active species containing carbon in the first plasma PL1, whereby a tungsten-containing deposit DP containing tungsten carbide ($WC_x$) is deposited on the upper surface of the first region R1. Alternatively, when the first processing gas contains hydrogen, the fluorine-containing active species in the first plasma PL1 is scavenged by the hydrogen-containing active species in the first plasma PL1. As a result, the tungsten-containing deposit DP derived from the active species containing tungsten remaining in the first plasma PL1 is deposited on the upper surface of the first region R1. When both carbon and hydrogen are contained in the first processing gas, the reaction between tungsten and carbon and the scavenging of fluorine by hydrogen proceed together.

In step ST3, a carbon-containing deposit may be formed on the first region R1 before forming the tungsten-containing deposit DP. In this case, the tungsten-containing deposit DP is formed on the carbon-containing deposit. The carbon-containing deposit is formed on the first region R1 using the plasma generated from the processing gas containing carbon. When the first region R1 and the second region R2 are exposed to plasma, the carbon-containing deposit may be formed preferentially on the first region R1 as compared to the second region R2. The processing gas containing carbon may contain a carbon-containing gas. The carbon-containing gas may contain at least one of $CH_4$ gas, $C_2H_2$ gas, $C_2H_4$ gas, $CH_3F$ gas, $CH_2F_2$ gas, $CHF_3$ gas, and CO gas. The processing gas may contain a noble gas such as argon gas, helium gas, xenon gas, or neon gas.

In step ST4, as illustrated in FIG. 7, the second plasma PL2 generated from the second processing gas is used to etch the second region R2. Etching may be performed as follows. First, the gas supply unit 20 supplies the second processing gas into the plasma processing chamber 10. Next, the plasma generation unit 12 generates a second plasma PL2 from the second processing gas in the plasma processing chamber 10. The control unit 2 controls the gas supply unit 20 and the plasma generation unit 12 to etch the second region R2 using the second plasma PL2.

The second processing gas is different from the first processing gas. In an example, the second processing gas may contain tungsten. As a result, deposits are likely to be formed, and etching of the shoulder portion SH in the recess R1a is suppressed. In another example, the second processing gas may not contain tungsten. The second processing gas may contain a fluorine-containing gas. The example of the second processing gas is the same as the example of the processing gas in step ST2.

In step ST4, since the first region R1 is covered with the tungsten-containing deposit DP, it is difficult to etch the first region R1. The second region R2 is more easily etched than the first region R1. By etching the second region R2, a contact hole HL is formed as illustrated in FIG. 7. The contact hole HL corresponds to the recess R1a of the first region R1. As described above, step ST4 may be performed in the self-aligned contact (SAC) process. After the second region R2 in the recess R1a is removed, the tungsten-containing deposit DP remains on the first region R1. Therefore, the etching of the first region R1 in step ST4 is suppressed. The tungsten-containing deposit DP may be removed by washing after step ST4.

In step ST5, it is determined whether the tungsten-containing deposit DP remains sufficiently. The determination may be performed by the control unit 2. When it is determined that the tungsten-containing deposit DP remains sufficiently, the process proceeds to step ST6. When it is determined that the tungsten-containing deposit DP does not remain sufficiently, the process proceeds to step ST3. The determination may be performed based on the etching time. For example, a relationship between the etching time in step ST4 and the amount of decrease in the tungsten-containing deposit DP is calculated in advance. Using the relationship, the decrease in tungsten-containing deposit DP is estimated from the remaining etching time needed to form the contact hole HL. When the value obtained by subtracting the estimated decrease in the tungsten-containing deposit DP from the initial amount of the tungsten-containing deposit DP is equal to or greater than a threshold value, it is determined that the tungsten-containing deposit DP remains sufficiently. Alternatively, the determination may be performed based on the reflected light obtained by irradiating the tungsten-containing deposit DP with light. For example, in step ST4, the reflected light obtained by irradiating the tungsten-containing deposit DP with light is measured. When the intensity of the reflected light having a wavelength corresponding to the tungsten-containing deposit DP is equal to or higher than a threshold value, it is determined that the tungsten-containing deposit DP remains sufficiently.

In step ST6, it is determined whether the etching stop condition of step ST4 has been satisfied. The determination may be performed by the control unit 2. When it is determined that the stop condition has been satisfied, the method MT is terminated. When it is determined that the stop condition has not been satisfied, the process returns to step ST3.

As described above, a cycle including step ST3 and step ST4 may be repeated two or more times.

According to the above-described method MT, a tungsten-containing deposit DP having excellent etching resistance may be formed. Although not bound by theory, the reason may be considered as follows. In step ST3, when the first processing gas contains hydrogen, the hydrogen-containing active species in the first plasma PL1 functions as a fluorine scavenger. As a result, since the fluorine concentration in the tungsten-containing deposit DP is reduced, the etching resistance of the tungsten-containing deposit DP in step ST4 is improved. In step ST3, when the first processing gas contains carbon, a carbon-tungsten bond is formed in the tungsten-containing deposit DP. As a result, the etching resistance of the tungsten-containing deposit DP in step ST4 is improved.

Further, according to the above-described method MT, the change in the thickness (loading effect) of the tungsten-containing deposit DP depending on the width of the opening OP of the mask MK may be suppressed as compared with the carbon-containing deposit. Therefore, it is possible to suppress the blockage of the contact hole HL by the tungsten-containing deposit DP while suppressing the etching of the first region R1 by the tungsten-containing deposit DP.

When the temperature of the substrate support unit 11 exceeds 100° C. in step ST3, the etching resistance of the tungsten-containing deposit DP is further improved. Although not bound by theory, the reason may be considered as follows. When the temperature of the substrate support unit 11 becomes higher, since the temperature of the substrate W rises, fluorine is removed from the tungsten-containing deposit DP. As a result, since the fluorine concentration in the tungsten-containing deposit DP is reduced, the etching resistance of the tungsten-containing deposit DP in step ST4 is improved.

When the counter electrode facing the substrate support unit 11 is sputtered in step ST3 or after step ST3, the etching resistance of the tungsten-containing deposit DP is further improved. Although not bound by theory, the reason may be considered as follows. When the counter electrode is sputtered, silicon is emitted from the counter electrode. Silicon functions as a scavenger for fluorine. As a result, since the fluorine concentration in the tungsten-containing deposit DP is reduced, the etching resistance of the tungsten-containing deposit DP in step ST4 is improved.

In step ST3, the bias power may not be applied to the electrodes in the main body 111 of the substrate support unit 11, or the applied bias power may be less than 100 W. In this case, it is possible to suppress the etching of the first region R1 by the first plasma PL1 when forming the tungsten-containing deposit DP.

Figure 8:
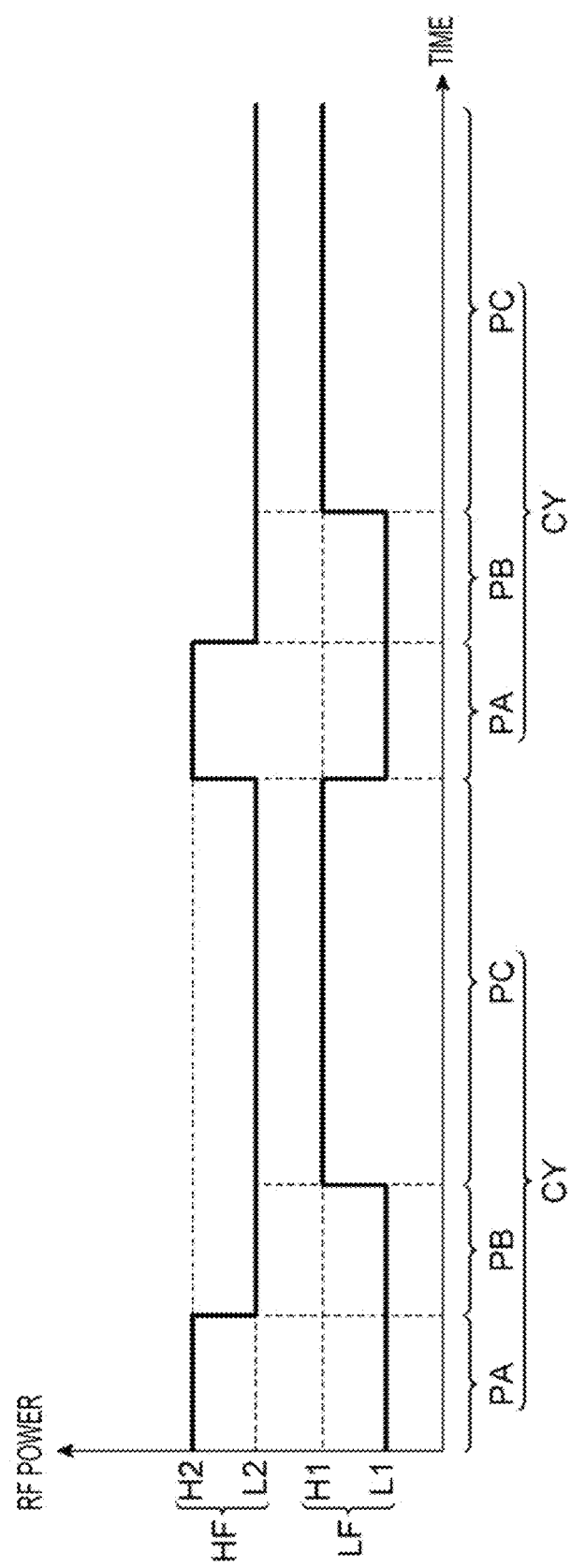
FIG. 8 is an example of a timing chart illustrating a time change of RF power applied to an electrode in a main body and RF power applied to a counter electrode.

FIG. 8 is an example of a timing chart illustrating time changes of the bias power applied to the electrodes in the main body 111 of the substrate support unit 11 and the RF power applied to the counter electrode. The timing chart relates to step ST4 in the method MT. In step ST4, bias power may be applied to the electrodes in the main body 111. The bias power may be, for example, RF power LF. The following description is an example of electric power used for a substrate W having a diameter of 300 mm. The RF power LF may be 10 W or more and 300 W or less, 30 W or more and 200 W or less, or 50 W or more and 100 W or less. The frequency of the RF power LF may be 100 kHz or more and 40.68 MHz or less. In step ST4, the RF power HF may be applied to the counter electrode. The RF power HF may be 50 W or more and 1,000 W or less, 80 W or more and 800 W or less, or 100 W or more and 500 W or less. The frequency of the RF power HF may be 27 MHz or more and 100 MHz or less. The RF power LF and the RF power HF may be periodically applied in a cycle CY. The bias power may be supplied to the conductive member of the substrate support unit 11. The RF power HF may also be supplied to an antenna including one or more coils.

The cycle CY may include a first period PA, a second period PB, and a third period PC. In the first period PA, the RF power LF is maintained at the low power L1 (e.g., less than 100 W) and the RF power HF is maintained at the high power H2 (e.g., over 100 W). In the first period PA, the deposition of carbon-containing films on the tungsten-containing deposit DP is promoted. In the second period PB, the RF power LF is maintained at the low power L1 and the RF power HF is maintained at the low power L2 (e.g., less than 200 W). The low power L2 is smaller than the high power H2 and larger than the low power L1. In the third period PC, the RF power LF is maintained at the high power H1 (e.g., over 50 W), and the RF power HF is maintained at the low power L2. The high power H1 is larger than the low power L1 and smaller than the high power H2. In the third period PC, the etching of the second region R2 is promoted. The second period PB is a transition period from the first period PA to the third period PC. In step ST4, one cycle corresponding to the cycle CY including the first period PA, the second period PB, and the third period PC may be repeated two or more times.

The proportion of the first period PA in the cycle CY is smaller than the proportion of the third period PC in the cycle CY. The proportion of the first period PA in the cycle CY may be 10% or more, or may be less than 50%. When the proportion of the first period PA is relatively large, the etching amount of the tungsten-containing deposit DP becomes smaller. When the proportion of the first period PA is relatively small, the blockage of the contact hole HL is suppressed. The proportion of the third period PC in the cycle CY may be 50% or more. When the proportion of the third period PC is relatively large, the etching rate of the second region R2 becomes larger. The frequency that defines the cycle CY may be 1 kHz or more and 1 MHz or less. The time length of the cycle CY is the inverse of the frequency that defines the cycle CY.

Step ST4 is not necessarily limited to the process performed according to the timing chart illustrated in FIG. 8. In step ST4, for example, the bias power applied to the electrodes in the main body 111 of the substrate support unit 11 and the RF power applied to the counter electrode may be constant.

Figure 9:
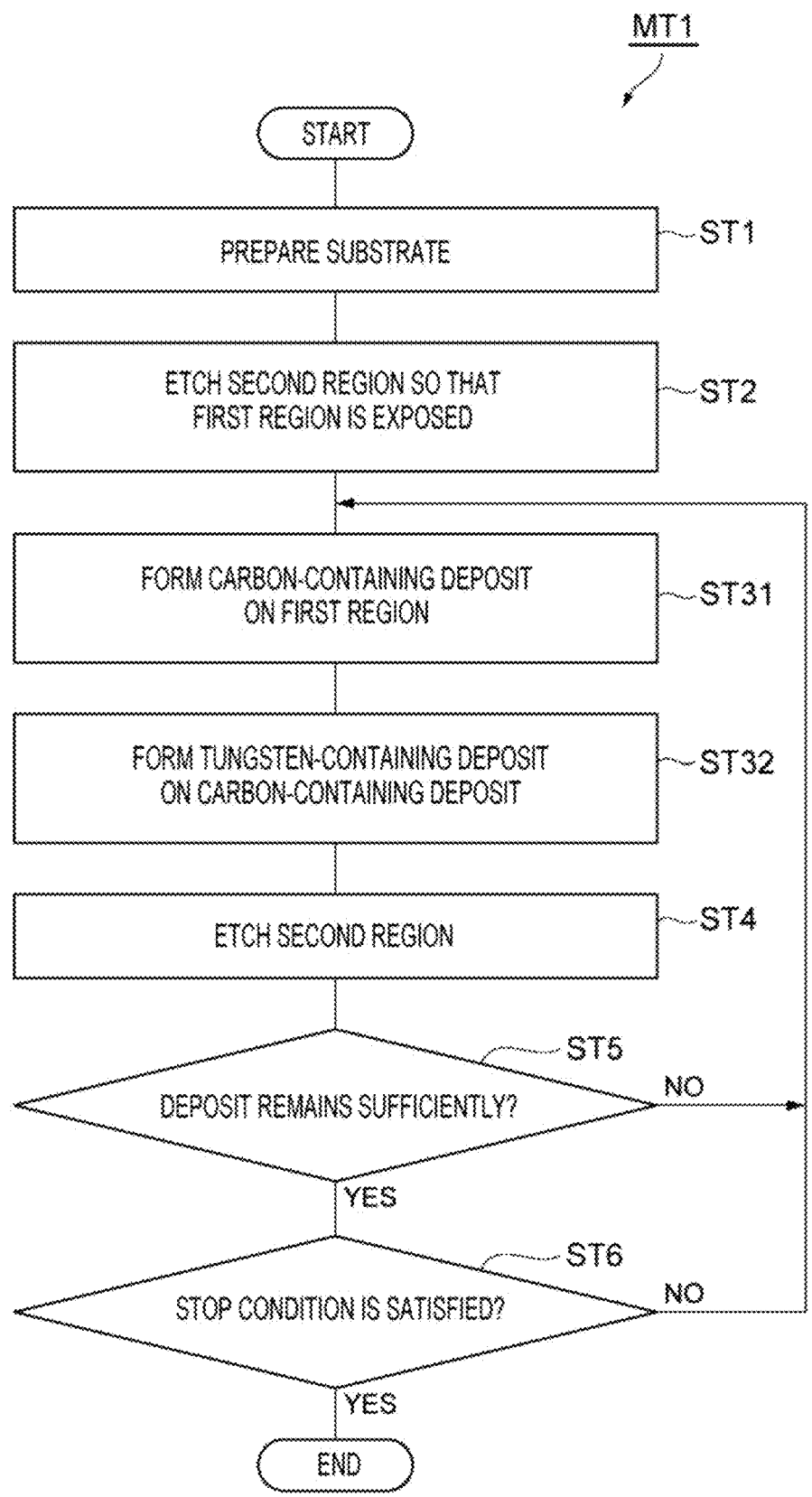
FIG. 9 is a flowchart of an etching method according to the embodiment.

FIG. 9 is a flowchart of an etching method according to the embodiment. The etching method MT1 (hereinafter, referred to as a "method MT1") illustrated in FIG. 9 may be executed by the plasma processing apparatus 1 of the above-described embodiment. The method MT1 may be applied to the substrate W.

Figure 10:
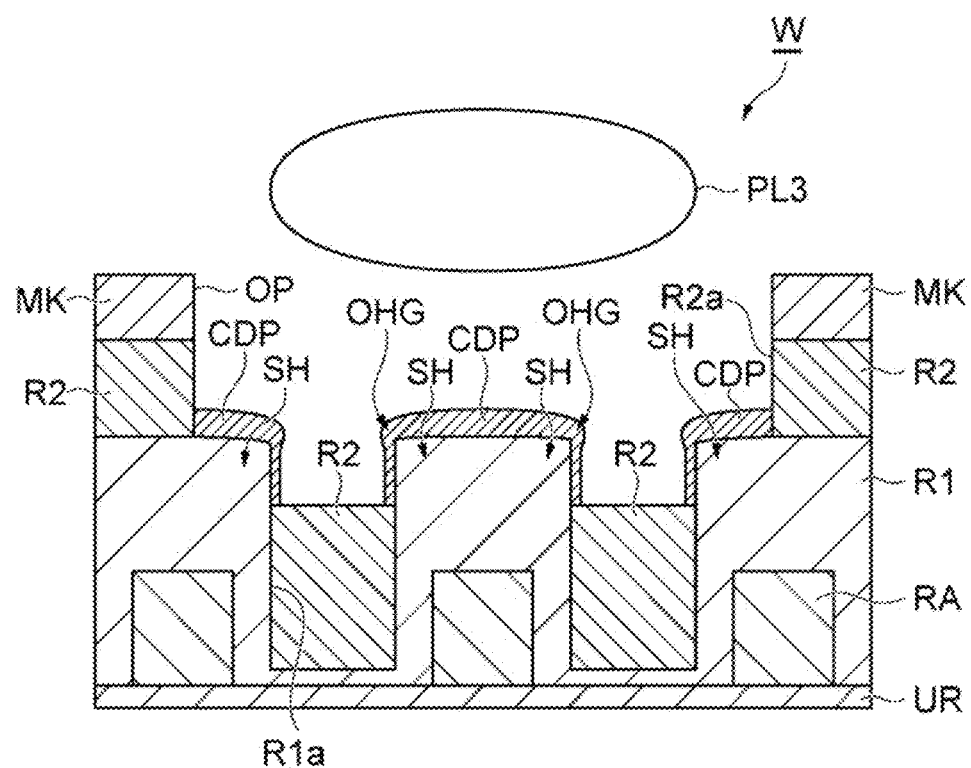
FIG. 10 is a cross-sectional view illustrating a process of the etching method according to the embodiment.
Figure 11:
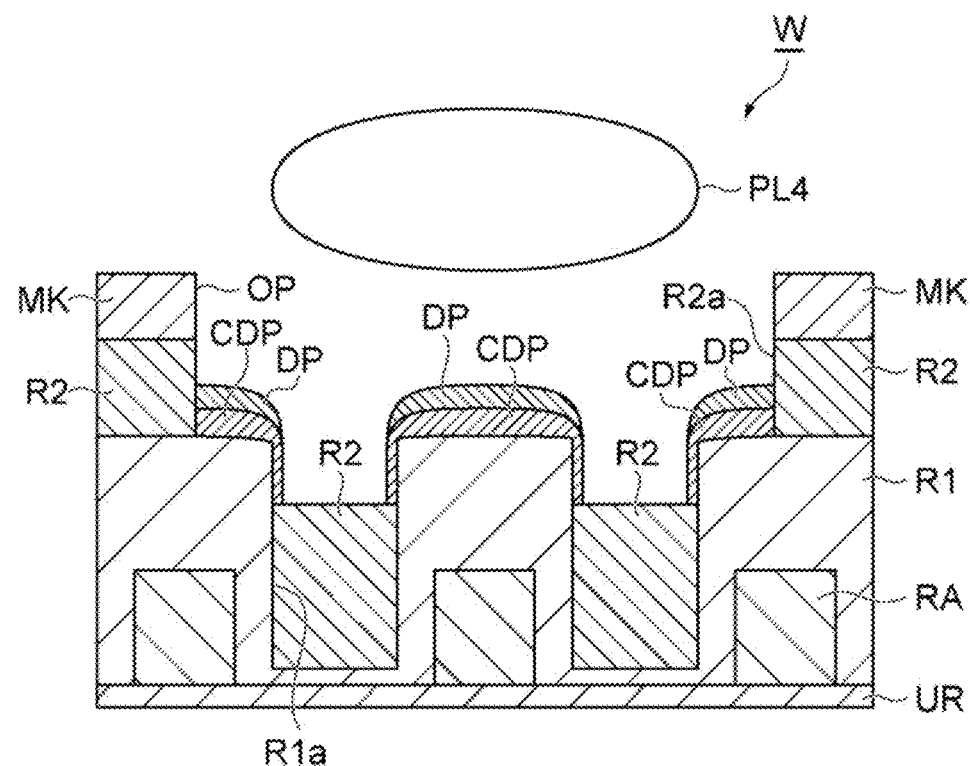
FIG. 11 is a cross-sectional view illustrating a process of the etching method according to the embodiment.
Figure 12:
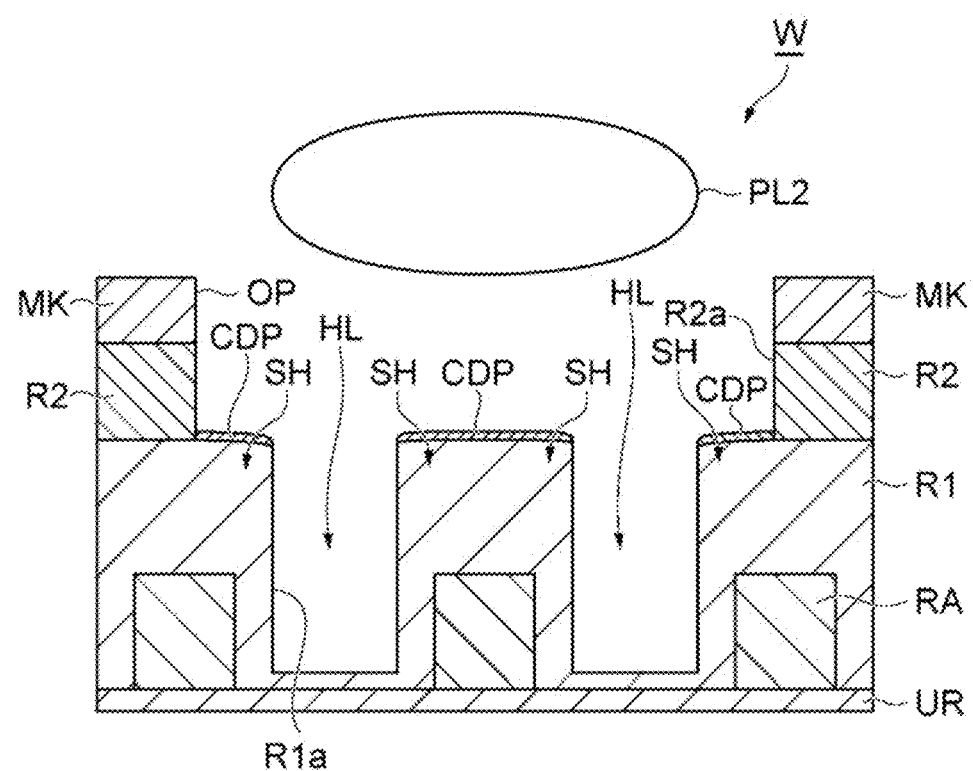
FIG. 12 is a cross-sectional view illustrating a process of the etching method according to the embodiment.

Hereinafter, the method MT1 will be described with reference to FIGS. 10 to 12 by taking the case where the method MT1 is applied to the substrate W by using the plasma processing apparatus 1 of the above-described embodiment as an example. FIGS. 10 to 12 are cross-sectional views illustrating a process of the etching method according to the embodiment. When the plasma processing apparatus 1 is used, the method MT1 may be executed in the plasma processing apparatus 1 by the control of each unit of the plasma processing apparatus 1 by the control unit 2. In the method MT1, as illustrated in FIG. 2, the substrate W on the substrate support unit 11 (substrate support) disposed in the plasma processing chamber 10 is processed.

As illustrated in FIG. 9, the method MT1 includes step ST31 and step ST32 in place of step ST3 included in the method MT of FIG. 3. Step ST31 may be performed after step ST2. Step ST32 may be performed after step ST31. Step ST4 may be performed after step ST32. Steps ST1 and ST2 and steps ST4 to ST6 may be performed in the same manner as in the method MT.

In step ST31, as illustrated in FIG. 10, a carbon-containing deposit CDP is formed on the first region R1. The carbon-containing deposit CDP may be formed using a third plasma PL3 generated from the third processing gas. The carbon-containing deposit CDP may contain a polymer. The carbon-containing deposit CDP may contain at least one of fluorine, oxygen, and hydrogen. The carbon-containing deposit CDP may be a carbon-containing film. The carbon-containing deposit CDP may include an overhanging portion OHG that covers the shoulder portion SH in the recess R1a of the first region R1. The overhanging portion OHG reduces the dimension of the recess R1a. When the first region R1 and the second region R2 are exposed to a third plasma PL3, the carbon-containing deposit CDP may be formed preferentially on the first region R1 as compared to the second region R2. The phrase "the carbon-containing deposit CDP may be formed preferentially on the first region R1 as compared to the second region R2" means that, for example, the thickness of the carbon-containing deposit CDP on the first region R1 is larger than the thickness of the carbon-containing deposit CDP on the second region R2, and more specifically, means that the thickness of the carbon-containing deposit CDP on the second region R2 is 50% or less of the thickness of the carbon-containing deposit CDP on the first region R1. Deposition may be performed as follows. First, the gas supply unit 20 supplies the third processing gas into the plasma processing chamber 10. Next, the plasma generation unit 12 generates the third plasma PL3 from the third processing gas in the plasma processing chamber 10. The control unit 2 controls the gas supply unit 20 and the plasma generation unit 12 so that the carbon-containing deposit DP is formed on the first region R1.

The third processing gas may contain a carbon-containing gas. The carbon-containing gas may contain at least one of hydrocarbon ($C_xH_y$) gas, fluorocarbon ($C_xF_y$) gas, and carbon monoxide (CO) gas. "x" and "y" are natural numbers. The third processing gas may contain a noble gas.

In step ST32, as illustrated in FIG. 11, a fourth plasma PL4 generated from the fourth processing gas is used to form a tungsten-containing deposit DP on the carbon-containing deposit CDP. Step ST32 may be executed in the same manner as step ST3 except that the fourth processing gas is used instead of the first processing gas. When the carbon-containing deposit CDP and the second region R2 are exposed to the fourth plasma PL4, the tungsten-containing deposit DP may be formed preferentially on the carbon-containing deposit CDP as compared with the second region R2. The phrase "the tungsten-containing deposit DP may be formed preferentially on the carbon-containing deposit CDP as compared with the second region R2" means that, for example, the thickness of the tungsten-containing deposit DP on the carbon-containing deposit CDP is larger than the thickness of the tungsten-containing deposit DP on the second region R2, and more specifically, means that the thickness of the tungsten-containing deposit DP on the second region R2 is 50% or less of the thickness of the tungsten-containing deposit DP on the carbon-containing deposit CDP. Deposition may be performed as follows. First, the gas supply unit 20 supplies the fourth processing gas into the plasma processing chamber 10. Next, the plasma generation unit 12 generates the fourth plasma PL4 from the fourth processing gas in the plasma processing chamber 10. The control unit 2 controls the gas supply unit 20 and the plasma generation unit 12 so that the tungsten-containing deposit DP is formed on the carbon-containing deposit CDP. The order of step ST31 and step ST32 is not limited to that illustrated in FIG. 9. For example, step ST31 may be performed after step ST32, and then step ST4 may be performed. The order of step ST31 and step ST32 may be changed for each cycle including step ST31 to step ST4.

The fourth processing gas contains fluorine and tungsten. The fourth processing gas may contain a tungsten-containing gas. Examples of tungsten-containing gases include tungsten hexafluoride.

The fourth processing gas may contain an inert gas such as a noble gas. The fourth processing gas may contain at least one of a carbon-containing gas and a hydrogen-containing gas. The examples of the carbon-containing gas and the hydrogen-containing gas are the same as the examples of the carbon-containing gas and the hydrogen-containing gas contained in the first processing gas. The flow rate ratio of the tungsten-containing gas may be the largest among all gases contained in the fourth processing gas except the inert gas. The fourth processing gas may contain only a tungsten-containing gas except the inert gas. The fourth processing gas may contain oxygen gas.

The electric power for generating the fourth plasma PL4 may be applied to the counter electrode facing the substrate support unit 11.

During step ST32 or after step ST32, the counter electrode facing the substrate support unit 11 may be sputtered. The counter electrode contains silicon. Sputtering improves the etching resistance of the tungsten-containing deposit DP.

In step ST5 of the method MT1, it is determined whether a deposit remains sufficiently on the first region R1. The deposit contains a carbon-containing deposit CDP. The deposit may contain a carbon-containing deposit CDP and a tungsten-containing deposit DP.

According to the above-described method MT1, the total thickness of the carbon-containing deposit CDP and the tungsten-containing deposit DP may be increased in step ST32. Therefore, it is possible to form a deposit having excellent etching resistance.

According to the above-described method MT1, in step ST32, the overhanging portion OHG of the carbon-containing deposit CDP may be removed while suppressing a decrease in the thickness of the carbon-containing deposit CDP on the first region R1. Therefore, it is possible to suppress a decrease in the dimension of the recess R1$a$ due to the overhanging portion OHG.

In step ST32, when the fourth processing gas does not contain either carbon or hydrogen, it is difficult for an overhanging portion to be formed in the tungsten-containing deposit DP. Therefore, it is possible to suppress a decrease in the dimension of the recess R1$a$ due to the overhanging portion of the tungsten-containing deposit DP. The formation of the overhanging portion in the tungsten-containing deposit DP may be facilitated by at least one of the carbon-containing gas and the hydrogen-containing gas.

In step ST32, when the electric power for generating the fourth plasma PL4 is applied to the counter electrode, it is possible to suppress the collision of the ions in the fourth plasma PL4 with the substrate W as compared with the case where the electric power is applied to the substrate support unit 11. Therefore, it is possible to suppress a decrease in the total thickness of the carbon-containing deposit CDP and the tungsten-containing deposit DP.

The method MT and the method MT1 may be applied to a substrate W that includes a second region R2 and a first region R1 provided on the second region R2 and having an opening. In this case, a contact hole is formed by etching the second region R2 with the first region R1 as a mask. The dimension of the contact hole may be 20 nm or more and 100 nm or less. The contact hole may be a high aspect ratio contact (HARC). The aspect ratio of the contact hole may be 2 or more.

The tungsten-containing deposit DP may be deposited for the purpose of declocking (i.e., suppressing the blockage of the opening). For example, when the opening is clocked (blocked) during etching, the tungsten-containing deposit DP may be deposited for the purpose of declocking, regardless of the presence or absence of deposits on the first region R1.

Figure 13:
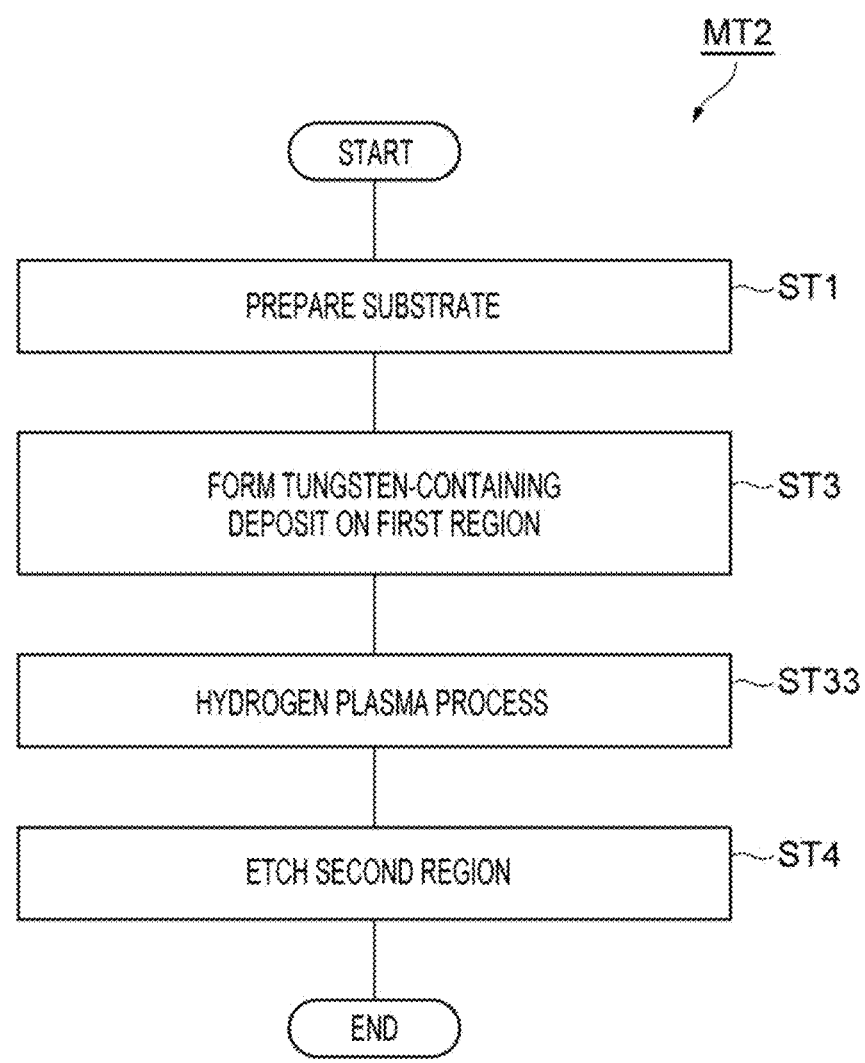
FIG. 13 is a flowchart of an etching method according to the embodiment.

FIG. 13 is a flowchart of an etching method according to the embodiment. The etching method MT2 (hereinafter, referred to as a "method MT2") illustrated in FIG. 13 may be executed by the plasma processing apparatus 1 of the above-described embodiment. The method MT2 may be applied to the substrate W of FIG. 14.

Figure 14:
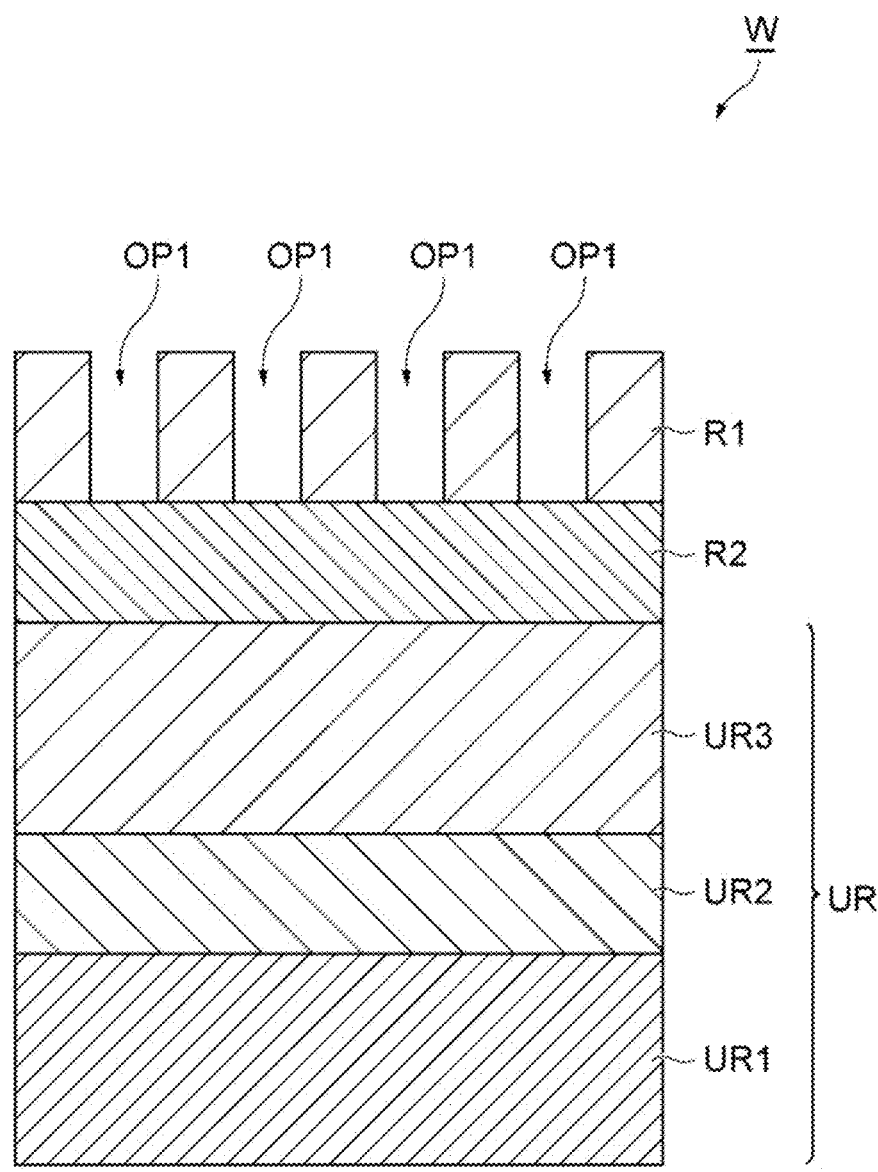
FIG. 14 is a partially enlarged cross-sectional view of a substrate to which the method of FIG. 13 may be applied.

FIG. 14 is a partially enlarged cross-sectional view of a substrate to which the method of FIG. 13 may be applied. As illustrated in FIG. 14, in the embodiment, the substrate W includes a first region R1 and a second region R2. The first region R1 may include at least one opening OP1. The first region R1 may include a plurality of openings OP1. The second region R2 may be provided below the first region R1. The substrate W may further include an underlying region UR. The underlying region UR may be provided below the second region R2.

The first region R1 may not contain silicon and nitrogen. The first region R1 may be a resist. The resist may be an extreme ultraviolet (EUV) resist.

The second region R2 contains silicon and nitrogen. The second region R2 may contain silicon nitride ($SiO_x$). The second region R2 may be a spin on glass (SOG) film.

The underlying region UR may include a first underlying region UR1, a second underlying region UR2, and a third underlying region UR3. The first underlying region UR1, the second underlying region UR2, and the third underlying region UR3 are disposed in order. The third underlying region UR3 is provided between the second region R2 and the second underlying region UR2. The first underlying region UR1, the second underlying region UR2, and the third underlying region UR3 may be stacked films.

The first underlying region UR1 may contain silicon and nitrogen. The first underlying region UR1 may contain silicon nitride ($SiN_x$). The second underlying region UR2 may contain silicon and oxygen. The second underlying region UR2 may contain silicon oxide ($SiO_x$). The third underlying region UR3 may be a spin on carbon (SOC) film or a carbon-containing film.

Figure 15:
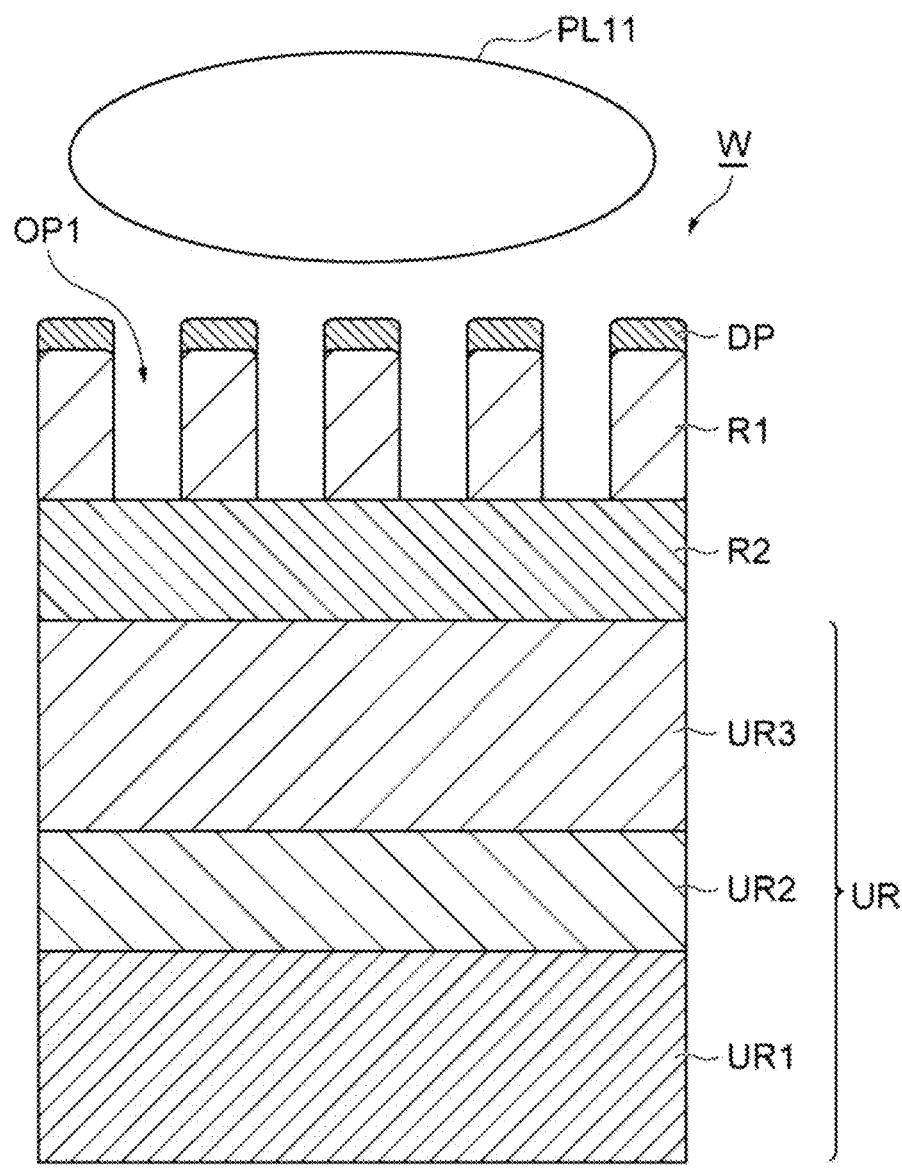
FIG. 15 is a cross-sectional view illustrating a process of the etching method according to the embodiment.
Figure 16:
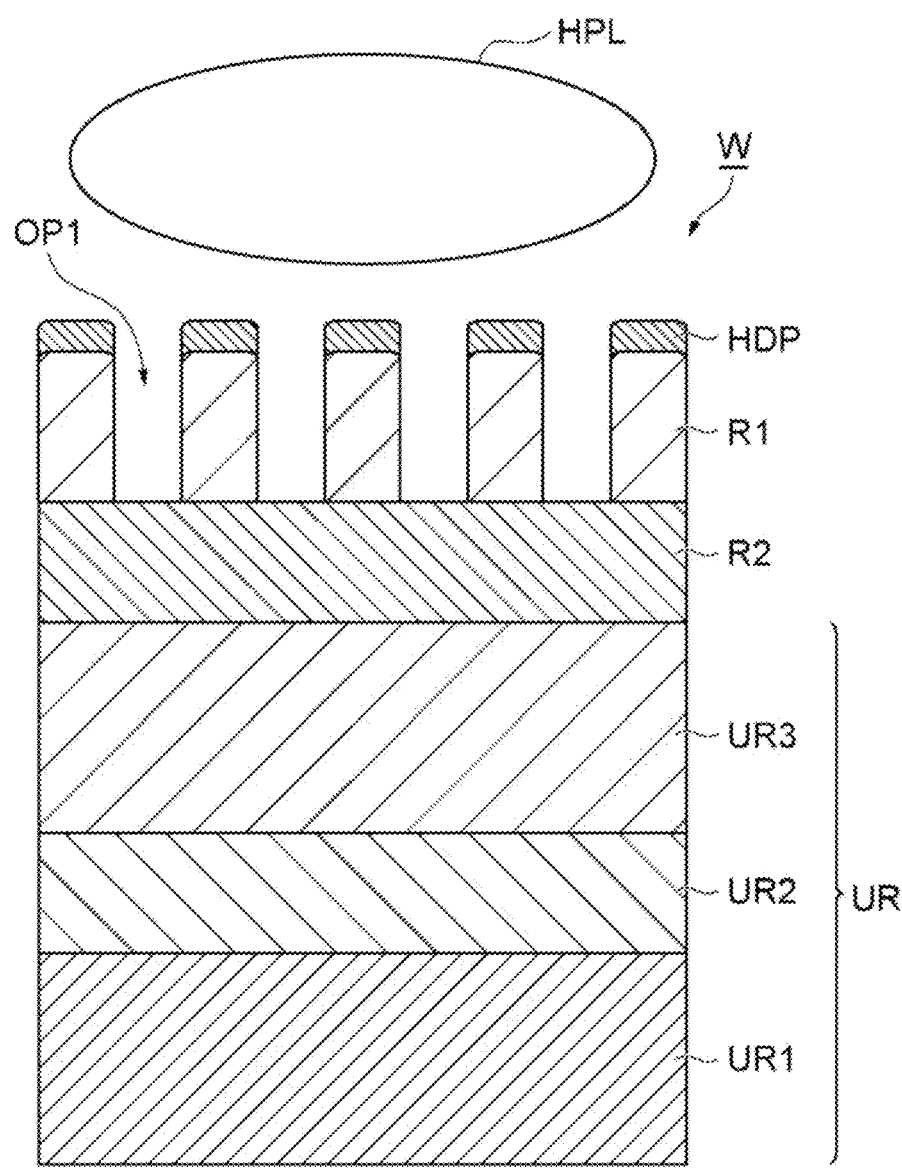
FIG. 16 is a cross-sectional view illustrating a process of the etching method according to the embodiment.
Figure 17:
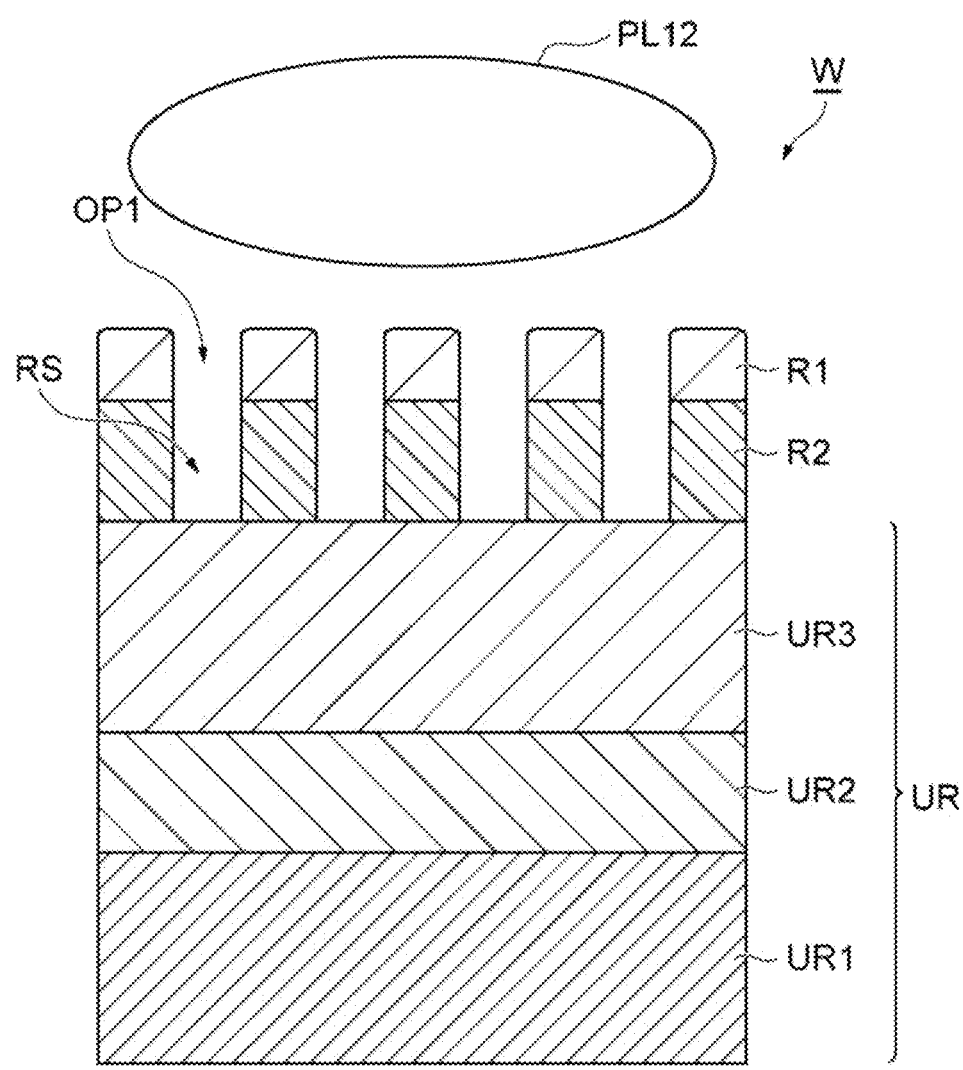
FIG. 17 is a cross-sectional view illustrating a process of the etching method according to the embodiment.

Hereinafter, the method MT2 will be described with reference to FIGS. 13 to 17 by taking the case where the method MT2 is applied to the substrate W by using the plasma processing apparatus 1 of the above-described embodiment as an example. FIGS. 15 to 17 are cross-sectional views illustrating a process of the etching method according to the embodiment. When the plasma processing apparatus 1 is used, the method MT2 may be executed in the plasma processing apparatus 1 by the control of each unit of the plasma processing apparatus 1 performed by the control unit 2. In the method MT2, as illustrated in FIG. 2, the substrate W on the substrate support unit 11 (substrate support) disposed in the plasma processing chamber 10 is processed.

As illustrated in FIG. 13, the method MT2 includes step ST1, step ST3, and step ST4. The method MT2 may further include step ST33 after step ST3 and before step ST4. In the method MT2, each step in the method MT and the method MT1 may be performed. Step ST1 of the method MT2 may be performed in the same manner as the method MT. Step ST3 and step ST4 of the method MT2 may be performed in the same manner as step ST3 and step ST4 of the method MT except for the following points.

In step ST3, as illustrated in FIG. 15, the first plasma PL11 generated from the first processing gas is used to form a tungsten-containing deposit DP on the first region R1. When the first plasma PL11 is exposed to the first region R1 and the second region R2, the tungsten-containing deposit DP may be preferentially formed on the first region R1 as compared to the second region R2.

The first processing gas may not contain carbon and hydrogen. The first processing gas contains a noble gas, fluorine, and tungsten. The first processing gas may contain a noble gas and a tungsten-containing gas. Fluorine may be contained in the tungsten-containing gas. The first processing gas may further contain a hydrogen-containing gas. The hydrogen-containing gas may contain at least one of $H_2$ gas, $SiH_4$ gas, and $CH_4$ gas. The first processing gas may not contain a noble gas. The first processing gas may contain a hydrogen-containing gas, fluorine, and tungsten. The example of the gas contained in the first processing gas is the same as the example of the gas contained in the first processing gas in step ST3 of the method MT. Other process conditions (a flow ratio of each gas, a processing time, a temperature, a pressure, an applied power, etc.) in step ST3 of the method MT2 may be the same as the process conditions in step ST3 of the method MT. However, in step ST3 of the method MT2, the temperature of the substrate support unit 11 may be 0° C. or higher, or 20° C. or higher.

In step ST33, as illustrated in FIG. 16, the tungsten-containing deposit DP may be exposed to the plasma HPL generated from the processing gas containing the hydrogen-containing gas (i.e., hydrogen plasma process). Thus, the tungsten-containing deposit DP may be reformed into the tungsten-containing deposit HDP. The tungsten-containing deposit HDP may contain metallic tungsten generated by reducing tungsten oxide by hydrogen plasma. The processing gas containing the hydrogen-containing gas may be different from the first processing gas in step ST3.

In step ST4, as illustrated in FIG. 17, the second plasma PL12 generated from the second processing gas is used to etch the second region R2 through the opening OP1. As a result, a recess RS is formed in the second region R2. The recess RS corresponds to the opening OP1 of the first region R1. The second processing gas may be different from the processing gas in step ST33. The process conditions (a type of a second processing gas, a flow rate ratio of each gas, a processing time, a temperature, a pressure, an applied power, etc.) in step ST4 of the method MT2 may be the same as the process conditions in step ST4 of the method MT.

According to the above-described method MT2, a tungsten-containing deposit DP having excellent etching resistance may be formed. As a result, since the remaining thickness of the first region R1 becomes larger after step ST4, the etching selectivity of the second region R2 with respect to the first region R1 becomes larger. The verticality of the side wall of the recess RS formed in the second region R2 is also improved.

When step ST33 is performed, the remaining thickness of the first region R1 after step ST4 is further increased. It is presumed that the etching resistance of the first region R1 is further improved by reducing tungsten oxide by the hydrogen plasma process to generate metallic tungsten.

Although various embodiments have been described above, the present disclosure is not limited to the embodiments described above, and various omissions, substitutions, and changes may be made. In addition, it is possible to combine the elements in different embodiments to form other embodiments.

For example, a molybdenum-containing gas may be used instead of the tungsten-containing gas or in addition to the tungsten-containing gas. The molybdenum-containing gas may contain a halogenated molybdenum gas. The halogenated molybdenum gas may contain at least one of molybdenum hexafluoride ($MoF_6$) gas and molybdenum hexachloride ($MoCl_6$) gas.

Hereinafter, descriptions will be made on various experiments conducted for evaluation of the method MT. The experiments described below do not limit the present disclosure.

(First Experiment)

In a first experiment, a substrate W including a first region R1 containing silicon nitride ($SiN_x$) and a second region R2 containing silicon oxide ($SiO_x$) was prepared. The upper surface of the first region R1 and the upper surface of the second region R2 were exposed. Then, step ST3 and step ST4 were executed on the substrate W using the plasma processing apparatus 1.

In step ST3, the first plasma PL1 was generated from the first processing gas, and the first region R1 and the second region R2 were exposed to the first plasma PL1. The first processing gas is a mixed gas of tungsten hexafluoride ($WF_6$) gas, methane ($CH_4$) gas, and argon (Ar) gas. The flow rate ratio of tungsten hexafluoride gas is smaller than the flow rate ratio of methane gas. The flow rate ratio of argon gas is larger than the flow rate ratio of methane gas.

In step ST3, the temperature of the substrate support unit 11 is 150° C. No negative DC voltage was applied to the counter electrode facing the substrate support unit 11.

In step ST4, the second plasma PL2 was generated from the second processing gas, and the second region R2 was etched. The second processing gas is a mixed gas of $C_4F_6$ gas, argon gas, and oxygen ($O_2$) gas.

(Second Experiment)

In a second experiment, the same method as that of the first experiment was executed except that the counter electrode facing the substrate support unit 11 was sputtered in step ST3. The counter electrode includes an inner first electrode and an outer second electrode. The absolute value of the DC voltage applied to the first electrode is 800 V. The absolute value of the DC voltage applied to the second electrode is 400 V.

(Third Experiment)

In a third experiment, the same method as that of the first experiment was executed except that a mixed gas of methane ($CH_4$) gas, carbon monoxide (CO) gas, and argon (Ar) gas was used as the first processing gas in step ST3.

(Fourth Experiment)

In a fourth experiment, the same method as that of the first experiment was executed except that a mixed gas of tungsten hexafluoride ($WF_6$) gas and argon (Ar) gas was used as the first processing gas in step ST3.

[Experimental Results]

Figure 18A:
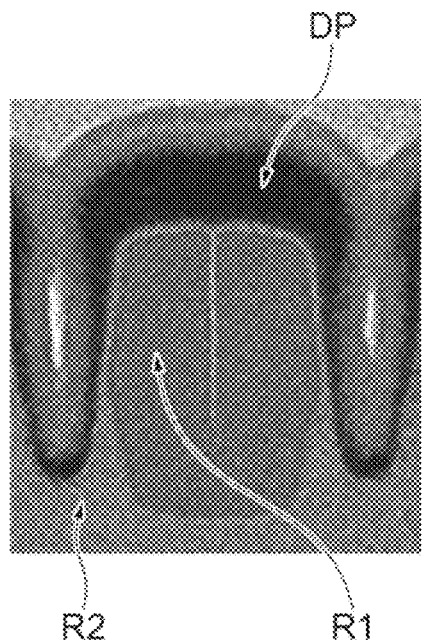
FIGS. 18A to 18D are views illustrating a TEM image of a cross section of a substrate obtained by performing an etching method in a first experiment and a second experiment.

The TEM images of the cross section of the substrate W in which the method was executed in the first to fourth experiments were observed. FIGS. 18A to 18D are views illustrating a TEM image of a cross section of a substrate obtained by performing the etching method in the first experiment and the second experiment. FIG. 18A illustrates a cross section of the substrate W after step ST3 and before step ST4 in the first experiment. FIG. 18B illustrates a cross section of the substrate W after step ST4 in the first experiment. In FIGS. 18A and 18B, a film (see the black portion in the figures) formed on the first region R1 was confirmed. From the results of TEM-EDX, it was confirmed that the portion corresponding to the film in FIG. 18A contains tungsten. That is, it was confirmed that the film in FIG. 18A was a tungsten-containing deposit DP. The thickness of the tungsten-containing deposit DP was measured in each of FIGS. 18A and 18B, and the amount of decrease in the tungsten-containing deposit DP by step ST4 was calculated. The amount of decrease in the tungsten-containing deposit DP in the first experiment was 4.0 nm. Further, the thickness of the entire deposit (the sum of the tungsten-containing deposit DP and the deposit on the tungsten-containing deposit DP) in FIG. 18B was measured, and the thickness of the tungsten-containing deposit DP in FIG. 18A was subtracted from the thickness to calculate the amount of decrease in the entire deposit. The amount of decrease in the entire deposit in the first experiment was 0.4 nm.

Figure 18C:
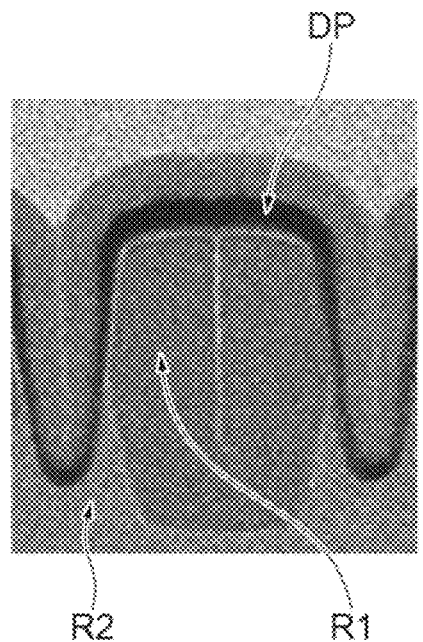
Figure 18B:
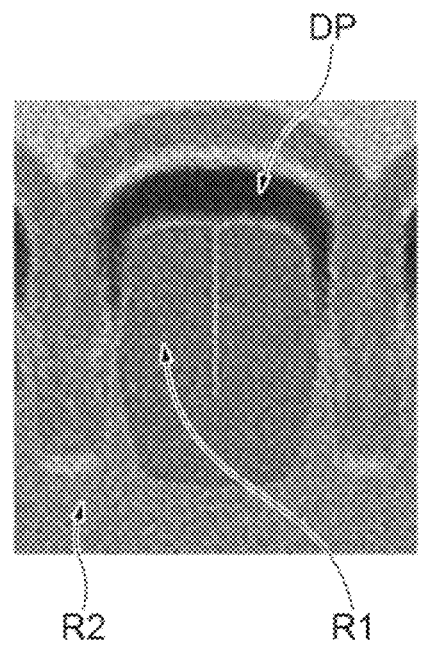
Figure 18D:
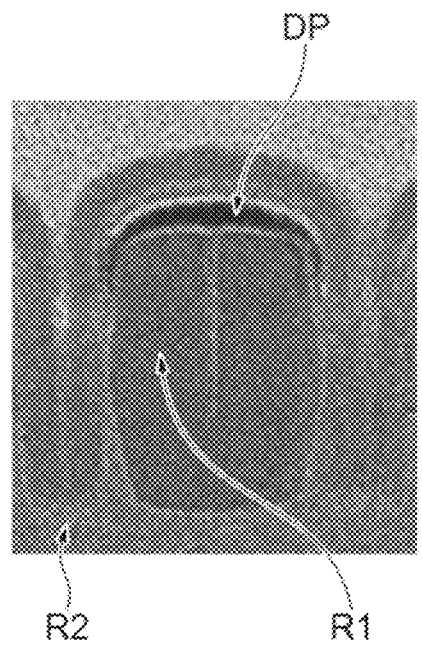

FIG. 18C illustrates a cross section of the substrate W after step ST3 and before step ST4 in the second experiment. FIG. 18D illustrates a cross section of the substrate W after step ST4 in the second experiment. In FIGS. 18C and 18D, the tungsten-containing deposit DP formed on the first region R1 was confirmed as in the first experiment. In the second experiment as well, the amount of decrease in the tungsten-containing deposit DP by step ST4 was calculated in the same manner as in the first experiment. The amount of decrease in the tungsten-containing deposit DP in the second experiment was 1.4 nm. Further, the thickness of the entire deposit in FIG. 18D was measured, and the thickness of the tungsten-containing deposit DP in FIG. 18C was subtracted from the thickness to calculate the amount of decrease in the entire deposit. The amount of decrease in the entire deposit in the second experiment was −2.6 nm, that is, the thickness of the entire deposit increased by 2.6 nm.

Figure 19A:
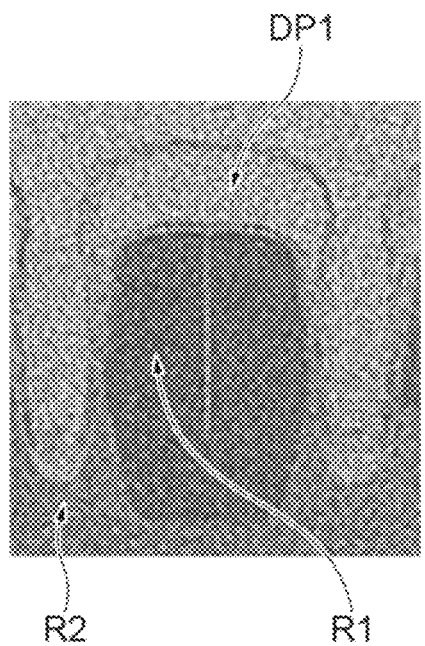
FIGS. 19A to 19D are views illustrating a TEM image of a cross section of a substrate obtained by performing an etching method in a third experiment and a fourth experiment.
Figure 19C:
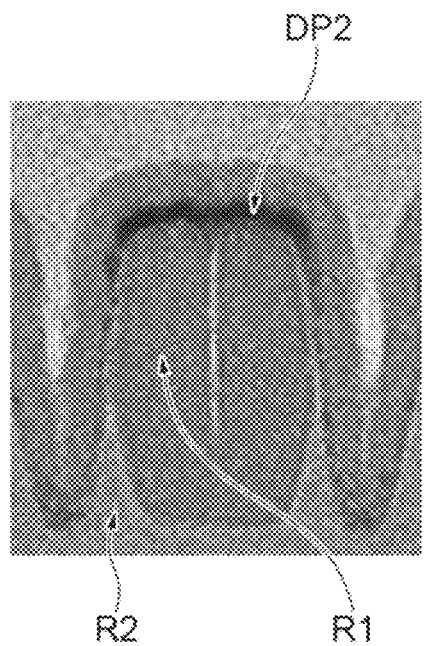
Figure 19B:
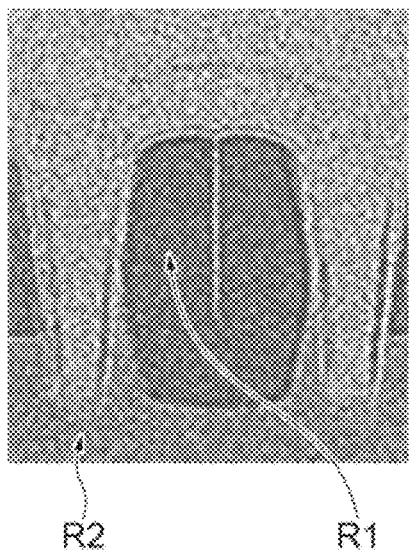

FIGS. 19A to 19D are views illustrating the TEM image of a cross section of the substrate obtained by performing the etching method in the third experiment and the fourth experiment. FIG. 19A illustrates a cross section of the substrate W after the deposition process and before the etching process in the third experiment. FIG. 19B illustrates a cross section of the substrate W after the deposition process in the third experiment. In FIGS. 19A and 19B, a carbon-containing film DP1 formed on the first region R1 was confirmed. In the third experiment as well, as in the first experiment, the thickness of the entire deposit in FIG. 19B was measured, and the thickness of the carbon-containing film DP1 in FIG. 19A was subtracted from the thickness to calculate the amount of decrease in the entire deposit. The amount of decrease in the entire deposit in the third experiment was 1.9 nm.

Figure 19D:
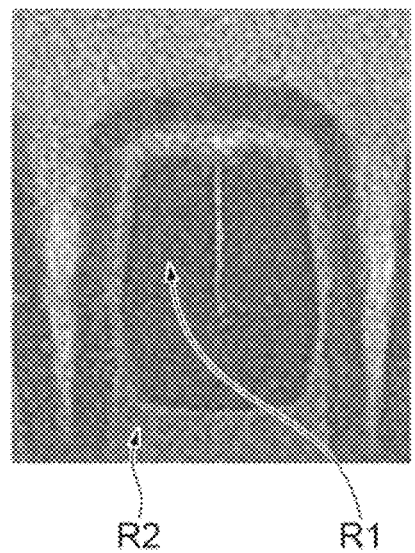

FIG. 19C illustrates a cross section of the substrate W after the deposition process and before the etching process in the fourth experiment. FIG. 19D illustrates a cross section of the substrate W after the etching process in the fourth experiment. In FIG. 19C, a tungsten-containing film DP2 formed on the first region R1 was confirmed. In FIG. 19D, the tungsten-containing film DP2 was not confirmed. In the fourth experiment, it may be seen that the tungsten-containing film DP2 was lost by the etching process.

From the results of the first to fourth experiments, it is possible to form a tungsten-containing deposit DP having excellent etching resistance when the first processing gas contains fluorine, tungsten, and at least one selected from a group consisting of carbon and hydrogen. Further, from the results of the first and second experiments, it may be seen that, when the counter electrode facing the substrate support unit 11 is sputtered, the etching resistance of the tungsten-containing deposit DP in step ST4 is further improved.

(Fifth Experiment)

In a fifth experiment, a substrate W including a first region R1 containing silicon nitride ($SiN_x$) and a second region R2 containing silicon oxide ($SiO_x$) was prepared. The upper surface of the first region R1 and the upper surface of the second region R2 were exposed. Then, step ST3 and step ST4 were executed on the substrate W using the plasma processing apparatus 1.

In step ST3, a plasma was first generated from a processing gas, which is a mixed gas of carbon monoxide (CO) gas and argon (Ar) gas, and the plasma was used to form a carbon-containing deposit on the first region R1. Next, a first plasma PL1 was generated from the first processing gas, and the first plasma PL1 was used to form a tungsten-containing deposit DP on the carbon-containing deposit. The first processing gas is a mixed gas of tungsten hexafluoride ($WF_6$) gas, hydrogen ($H_2$) gas, and argon (Ar) gas. The flow rate ratio of tungsten hexafluoride gas is smaller than the flow rate ratio of hydrogen gas. The flow rate ratio of argon gas is larger than the flow rate ratio of hydrogen gas.

In step ST3, the temperature of the substrate support unit 11 is 150° C. The counter electrode includes an inner first electrode and an outer second electrode. The absolute value of the DC voltage applied to the first electrode is 800 V. The absolute value of the DC voltage applied to the second electrode is 400 V.

In step ST4, the second plasma PL2 was generated from the second processing gas, and the second region R2 was etched. The second processing gas is a mixed gas of $C_4F_6$ gas, argon gas, and oxygen ($O_2$) gas.

(Experimental Results)

Figure 20A:
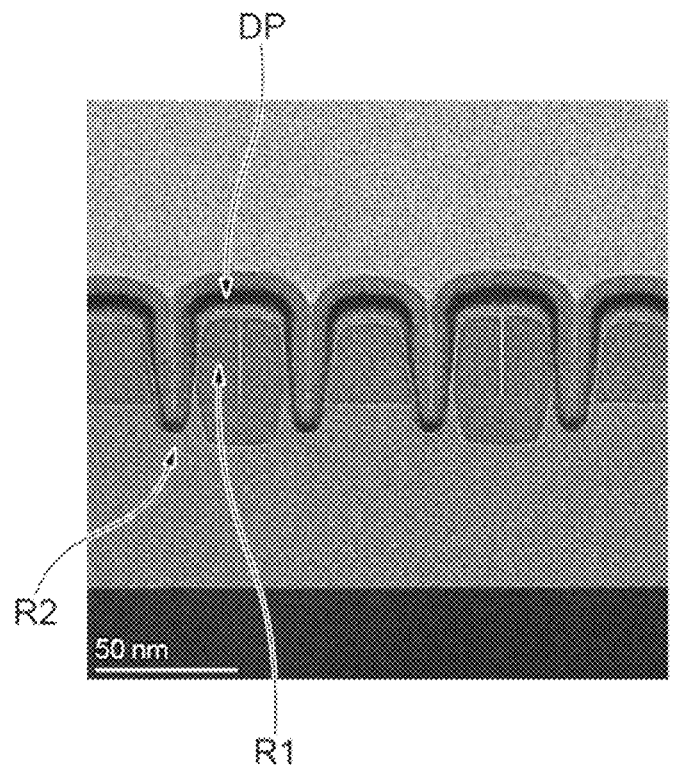
FIGS. 20A and 20B are views illustrating a TEM image of a cross section of a substrate obtained by performing an etching method in a fifth experiment.
Figure 20B:
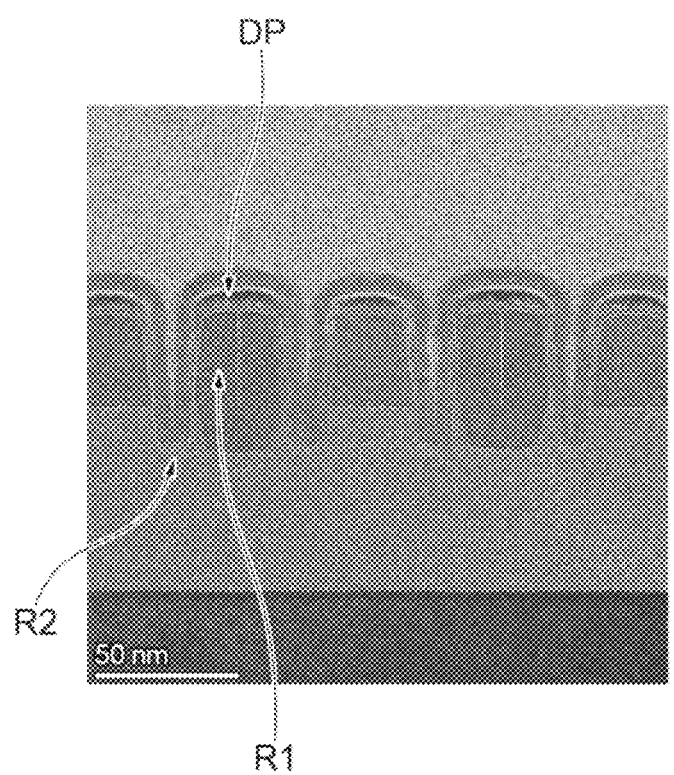

The TEM images of the cross section of the substrate W in which the method was executed in the fifth experiment were observed. FIGS. 20A and 20B are views illustrating a TEM image of a cross section of the substrate obtained by performing the etching method in the fifth experiment. FIG. 20A illustrates a cross section of the substrate W after step ST3 and before step ST4 in the fifth experiment. FIG. 20B illustrates a cross section of the substrate W after step ST4 in the fifth experiment. In FIGS. 20A and 20B, the tungsten-containing deposit DP formed on the first region R1 was confirmed as in the first experiment. In the fifth experiment as well, the amount of decrease in the tungsten-containing deposit DP by step ST4 was calculated in the same manner as in the first experiment. The amount of decrease in the tungsten-containing deposit DP in the fifth experiment was 1.2 nm. The thickness of the entire deposit in FIG. 20B was measured, and the thickness of the tungsten-containing deposit DP in FIG. 20A was subtracted from the thickness to calculate the amount of decrease in the entire deposit. The amount of decrease in the entire deposit in the fifth experiment was 0.9 nm.

From the results of the fifth experiment, it may be seen that it is possible to form a tungsten-containing deposit DP having excellent etching resistance when the first processing gas contains the hydrogen-containing gas.

(Sixth Experiment)

In a sixth experiment, the same method as that of the first experiment was executed except that carbon monoxide (CO) gas was added to the first processing gas in step ST3. The flow rate ratio of carbon monoxide gas is larger than the flow rate ratio of methane gas.

(Seventh Experiment)

In a seventh experiment, the same method as that of the first experiment was executed except that hydrogen ($H_2$) gas was added to the first processing gas in step ST3. The flow rate ratio of hydrogen gas is larger than the flow rate ratio of methane gas.

(Eighth Experiment)

In an eighth experiment, the same method as that of the second experiment was executed except that carbon monoxide (CO) gas was added to the first processing gas in step ST3. The flow rate ratio of carbon monoxide gas is larger than the flow rate ratio of methane gas.

(Ninth Experiment)

In a ninth experiment, the same method as that of the second experiment was executed except that hydrogen ($H_2$) gas was added to the first processing gas in step ST3. The flow rate ratio of hydrogen gas is larger than the flow rate ratio of methane gas.

(Experimental Results)

The TEM images of the cross section of the substrate W in which the method was executed in the sixth to ninth experiments were observed. In the sixth to ninth experiments as well, the amount of decrease in the tungsten-containing deposit DP by step ST4 was calculated in the same manner as in the first experiment. The amount of decrease in the tungsten-containing deposit DP in the sixth experiment was 3.8 nm. The amount of decrease in the tungsten-containing deposit DP in the seventh experiment was 2.3 nm. The amount of decrease in the tungsten-containing deposit DP in the eighth experiment was 3.7 nm. The amount of decrease in the tungsten-containing deposit DP in the ninth experiment was 1.7 nm. Further, in the sixth to ninth experiments as well, the amount of decrease in the entire deposit was calculated in the same manner as in the first experiment. The amount of decrease in the entire deposit in the sixth experiment was 1.2 nm. The amount of decrease in the entire deposit in the seventh experiment was −0.7 nm, that is, the thickness of the entire deposit increased by 0.7 nm. The amount of decrease in the entire deposit in the eighth experiment was 0.7 nm. amount of decrease in the entire deposit in the ninth experiment was −1.4 nm, that is, the thickness of the entire deposit increased by 1.4 nm.

From the results of the sixth to ninth experiments, it may be seen that the tungsten-containing deposit DP having excellent etching resistance may be formed even when the gas type of the first processing gas is different. Further, it may be seen that the deposition rate of the tungsten-containing deposit DP may be controlled by changing the gas type of the first processing gas. From the results of the sixth to ninth experiments, it may be seen that when a negative DC voltage is applied to the counter electrode facing the substrate support unit 11, the etching resistance of the tungsten-containing deposit DP in step ST4 is further improved.

(Tenth Experiment)

In a tenth experiment, in the deposition process corresponding to step ST3, the same method as the method of the fourth experiment was executed except that the temperature of the substrate support unit 11 was 100° C.

(Experimental Results)

The TEM images of the cross section of the substrate W in which the method was executed in the fourth to ninth experiments were observed. In the tenth experiment, a tungsten-containing film DP2 thicker than the tungsten-containing film DP2 illustrated in FIG. 19C was confirmed. However, in the tenth experiment, it was confirmed that the tungsten-containing film DP2 was lost by the etching process and the upper surface of the first region R1 was etched.

From the results of the fourth and tenth experiments, it may be seen that when the temperature of the substrate support unit 11 exceeds 100° C., the etching resistance of the tungsten-containing film DP2 in the etching process is improved.

Hereinafter, descriptions will be made on various experiments conducted for evaluation of the method MT. The experiments described below do not limit the present disclosure.

(Eleventh Experiment)

In an eleventh experiment, a substrate W including a first region R1 containing silicon nitride ($SiN_x$) and a second region R2 containing silicon oxide ($SiO_x$) was prepared. The upper surface of the first region R1 and the upper surface of the second region R2 were exposed. Then, step ST31, step ST32, and step ST4 were executed on the substrate W using the plasma processing apparatus 1.

In step ST31, the third plasma PL3 was generated from the first processing gas, and the first region R1 and the second region R2 were exposed to the third plasma PL3. The third processing gas is a mixed gas of $C_4F_6$ gas, argon gas, and oxygen ($O_2$) gas. A carbon-containing deposit CDP was formed on the first region R1 by step ST31.

In step ST32, the fourth plasma PL4 was generated from the fourth processing gas, and the carbon-containing deposit CDP and the second region R2 were exposed to the fourth plasma PL4. The fourth processing gas is a mixed gas of tungsten hexafluoride ($WF_6$) gas and argon (Ar) gas. A tungsten-containing deposit DP was formed on the carbon-containing deposit CDP by step ST32.

In step ST4, the second plasma PL2 was generated from the second processing gas, and the second region R2 was etched. The second processing gas is a mixed gas of $C_4F_6$ gas, argon gas, and oxygen ($O_2$) gas.

(Twelfth Experiment)

In a twelfth experiment, the same method as that of the eleventh experiment was executed except that a mixed gas of carbon monoxide (CO) gas and argon (Ar) gas was used as the third processing gas in step ST31.

(Thirteenth Experiment)

In a thirteenth experiment, the same method as that of the eleventh experiment was executed except that a mixed gas of methane ($CH_4$) gas and argon (Ar) gas was used as the third processing gas in step ST31.

(Fourteenth Experiment)

In a fourteenth experiment, the same method as in the eleventh experiment was executed except that step ST31 was not executed.

(Experimental Results)

In the eleventh to fourteenth experiments, TEM images of the cross section of the substrate W after step ST31 and after step ST32 were observed.

In the eleventh experiment, after step ST31, the thickness of the carbon-containing deposit CDP on the upper surface of the first region R1 was 6.7 nm. After step ST32, the sum of the thicknesses of the carbon-containing deposit CDP and the tungsten-containing deposit DP on the upper surface of the first region R1 was 20.4 nm. Also, after step ST32, the carbon-containing deposit CDP did not have an overhanging portion.

In the twelfth experiment, after step ST31, the thickness of the carbon-containing deposit CDP on the upper surface of the first region R1 was 4.5 nm. After step ST32, the thicknesses of the carbon-containing deposit CDP on the upper surface of the first region R1 was 3.8 nm, and the thicknesses of the tungsten-containing deposit DP was 10.7 nm. Also, after step ST32, the carbon-containing deposit CDP did not have an overhanging portion.

In the thirteenth experiment, after step ST31, the thickness of the carbon-containing deposit CDP on the upper surface of the first region R1 was 7.8 nm. After step ST32, the thicknesses of the carbon-containing deposit CDP on the upper surface of the first region R1 was 7.8 nm, and the thicknesses of the tungsten-containing deposit DP was 5.9 nm. Also, after step ST32, the carbon-containing deposit CDP did not have an overhanging portion.

In the fourteenth experiment, after step ST32, the thickness of the carbon-containing deposit CDP was 4.4 nm. No carbon-containing deposits were formed on the upper surface of the first region R1.

From the results of the eleventh to fourteenth experiments, it may be seen that the sum of thicknesses of the carbon-containing deposit CDP and the tungsten-containing deposit DP may be increased according to the method MT1. Further, it may be seen that the overhanging portion of the carbon-containing deposit CDP may be removed according to the method MT1.

(Fifteenth Experiment)

In a fifteenth experiment, the same method as that of the twelfth experiment was executed except that the counter electrode facing the substrate support unit 11 was sputtered using a different type of fourth processing gas in step ST32. The fourth processing gas is a mixed gas of tungsten hexafluoride ($WF_6$) gas, argon (Ar) gas, methane ($CH_4$) gas, and carbon monoxide (CO) gas. The flow rate ratio of tungsten hexafluoride gas is smaller than the flow rate ratio of methane ($CH_4$) gas and smaller than the flow rate ratio of carbon monoxide (CO) gas.

(Sixteenth Experiment)

In a sixteenth experiment, the same method as that of the twelfth experiment was executed except that the counter electrode facing the substrate support unit 11 was sputtered using a different type of fourth processing gas in step ST32. The fourth processing gas is a mixed gas of tungsten hexafluoride ($WF_6$) gas, methane ($CH_4$) gas, and hydrogen ($H_2$) gas. The flow rate ratio of tungsten hexafluoride gas is smaller than the flow rate ratio of methane ($CH_4$) gas and smaller than the flow rate ratio of hydrogen ($H_2$) gas.

(Seventeenth Experiment)

In a seventeenth experiment, the same method as that of the twelfth experiment was executed except that the counter electrode facing the substrate support unit 11 was sputtered using a different type of fourth processing gas in step ST32. The fourth processing gas is a mixed gas of tungsten hexafluoride ($WF_6$) gas, argon (Ar) gas, and hydrogen ($H_2$) gas. The flow rate ratio of tungsten hexafluoride gas is smaller than the flow rate ratio of hydrogen gas.

(Experimental Results)

In the twelfth experiment and the fifteen to seventeenth experiments, TEM images of the cross section of the substrate W after step ST32 were observed.

In the twelfth experiment, after step ST32, the sum of thicknesses of the carbon-containing deposit CDP and the tungsten-containing deposit DP was 14.5 nm. The tungsten-containing deposit DP did not have an overhanging portion.

In the fifteenth experiment, after step ST32, the sum of thicknesses of the carbon-containing deposit CDP and the tungsten-containing deposit DP was 11.0 nm. The carbon-containing deposit DP did not have an overhanging portion. The tungsten-containing deposit DP had an overhanging portion.

In the sixteenth experiment, after step ST32, the sum of thicknesses of the carbon-containing deposit CDP and the tungsten-containing deposit DP was 10.0 nm. The carbon-containing deposit DP did not have an overhanging portion. The tungsten-containing deposit DP had an overhanging portion.

In the seventeenth experiment, after step ST32, the sum of thicknesses of the carbon-containing deposit CDP and the tungsten-containing deposit DP was 10.0 nm. The carbon-containing deposit DP did not have an overhanging portion. The tungsten-containing deposit DP had an overhanging portion.

From the results of the twelfth experiment and the fifteenth to seventeenth experiments, it may be seen that in step ST32, when the fourth processing gas does not contain either carbon or hydrogen, it is difficult to form an overhanging portion in the tungsten-containing deposit DP.

(Eighteenth Experiment)

In an eighteenth experiment, the same method as in the thirteenth experiment was executed.

(Nineteenth Experiment)

In a nineteenth experiment, the same method as in the eighteenth experiment was executed except that the counter electrode facing the substrate support unit 11 was sputtered between step ST32 and step ST4.

(Experimental Results)

In the eighteenth and nineteenth experiments, TEM images of the cross section of the substrate W before and after step ST4 were observed.

In the eighteenth experiment, after step ST4, the sum of thicknesses of the carbon-containing deposit CDP and the tungsten-containing deposit DP was 12.3 nm. After step ST4, the thickness of the carbon-containing deposit CDP was 5.6 nm.

In the nineteenth experiment, after step ST4, the sum of thicknesses of the carbon-containing deposit CDP and the tungsten-containing deposit DP was 12.0 nm. After step ST4, the sum of thicknesses of the carbon-containing deposit CDP and the tungsten-containing deposit DP was 11.6 nm.

Further, from the results of the eighteenth and nineteenth experiments, it may be seen that when the counter electrode facing the substrate support unit 11 is sputtered, the etching resistance of the tungsten-containing deposit DP is improved.

Hereinafter, descriptions will be made on various experiments conducted for evaluation of the method MT2. The experiments described below do not limit the present disclosure.

(Twentieth Experiment)

In a twentieth experiment, a substrate W having the structure illustrated in FIG. 14 was prepared. The first region R1 is a resist. The second region R2 is a silicon oxide film. Then, step ST3 and step ST4 were executed on the substrate W using the plasma processing apparatus 1 (see, e.g., FIG. 13).

In step ST3, the first plasma PL11 was generated from the first processing gas, and the first region R1 and the second region R2 were exposed to the first plasma PL11 (see, e.g., FIG. 15). The first processing gas is a mixed gas of tungsten hexafluoride ($WF_6$) gas and argon (Ar) gas. The flow rate ratio of tungsten hexafluoride gas is smaller than the flow rate ratio of argon gas.

In step ST3, the temperature of the substrate support unit 11 is 20° C. The RF power applied to the counter electrode facing the substrate support unit 11 is 100 W. Bias power is not applied to the electrodes in the main body 111 of the substrate support unit 11.

In step ST4, the second plasma PL12 was generated from the second processing gas, and the second region R2 was etched (see, e.g., FIG. 17). The second processing gas is a mixed gas of $CF_4$ gas and nitrogen ($N_2$) gas.

(Twenty-First Experiment)

In a twenty-first experiment, the same method as in the twentieth experiment was executed except that step ST33 was executed between step ST3 and step ST4.

In step ST33, the tungsten-containing deposit DP was exposed to a plasma HPL generated from hydrogen ($H_2$) gas (see, e.g., FIG. 16).

In step ST33, the RF power applied to the counter electrode facing the substrate support unit 11 is 100 W. Bias power is not applied to the electrodes in the main body 111 of the substrate support unit 11.

(Twenty-Second Experiment)

In a twenty-second experiment, the same method as in the twentieth experiment was executed except that step ST3 was not executed.

(Experimental Results)

In the twentieth experiment, TEM images of a cross section of the substrate W after step ST3 were observed. It was found that a tungsten-containing deposit DP having a thickness of about 7 nm was formed on the first region R1. In addition, from the results of TEM-EDX, it was confirmed that the tungsten-containing deposit DP contains tungsten. No tungsten-containing deposit was confirmed on the second region R2 in the opening OP1.

The TEM images of the cross section of the substrate W in which the method was executed in the twentieth to twenty-second experiments were observed. In the twentieth experiment, the remaining thickness of the first region R1 after etching was 17.2 nm. In the twenty-first experiment, the remaining thickness of the first region R1 after etching was 20.8 nm. In the twenty-second experiment, the remaining thickness of the first region R1 after etching was 9.3 nm. Further, in the twentieth and twenty-first experiments, the verticality of the side wall of the recess RS formed in the second region R2 was improved as compared with the twenty-second experiment. In the twentieth to twenty-second experiments, the dimensional uniformity LCDU of the local recess RS was the same in each of the recess RS having a relatively large dimension and the recess RS having a relatively small dimension.

APPENDIX 1

An etching method including:
(a) providing a substrate including a first region containing silicon and nitrogen and a second region containing silicon and oxygen;
(b) forming a tungsten-containing deposit on the first region using a first plasma generated from a first processing gas containing fluorine, tungsten, and at least one selected from a group consisting of carbon and hydrogen; and
(c) after (b), etching the second region using a second plasma generated from a second processing gas different from the first processing gas.

APPENDIX 2

The etching method according to appendix 1, wherein the first processing gas contains a tungsten-containing gas and at least one selected from a group consisting of a carbon-containing gas and a hydrogen-containing gas.

APPENDIX 3

The etching method according to appendix 2, wherein the tungsten-containing gas contains a tungsten hexafluoride gas.

APPENDIX 4

The etching method according to appendix 2 or 3, wherein the carbon-containing gas contains at least one of $CH_4$ gas, $C_2H_2$ gas, $C_2H_4$ gas, $CH_3F$ gas, $CH_2F_2$ gas, $CHF_3$ gas, and CO gas.

APPENDIX 5

The etching method according to any one of appendixes 2 to 4, wherein the hydrogen-containing gas contains at least one of $H_2$ gas, $SiH_4$ gas, and $NH_3$ gas.

APPENDIX 6

The etching method according to any one of appendixes 1 to 5, wherein in (a), the second region is provided to cover the first region, and the etching method further includes:
(d) after (a) and before (b), etching the second region such that the first region is exposed.

APPENDIX 7

The etching method according to any one of appendixes 1 to 6, wherein in (b), a temperature of a substrate support that supports the substrate is over 100° C.

APPENDIX 8

The etching method according to any one of appendixes 1 to 7, further including, in (b) or after (b), sputtering a counter electrode containing silicon and facing the substrate support supporting the substrate.

APPENDIX 9

The etching method according to any one of appendixes 1 to 8, wherein the first region has a recess and the second region is embedded in the recess.

APPENDIX 10

The etching method according to appendix 9, wherein (c) is performed in a self-aligned contact process.

APPENDIX 11

The etching method according to any one of appendixes 1 to 10, wherein a cycle including (b) and (c) is repeated two or more times.

APPENDIX 12

An etching method including:
(a) providing a substrate that includes a silicon nitride having an exposed upper surface and a silicon oxide having an exposed upper surface;
(b) forming a tungsten-containing deposit on the silicon nitride using a first plasma generated from a first processing gas containing a tungsten hexafluoride gas and at least one selected from a group consisting of a carbon-containing gas and a hydrogen-containing gas; and (c) after (b), etching the silicon oxide using a second plasma generated from a second processing gas different from the first processing gas.

APPENDIX 13

A plasma processing apparatus including:
a chamber;
a substrate support configured to support a substrate in the chamber;
a gas supply configured to supply a first processing gas and a second processing gas different from the first processing gas into the chamber;
a plasma generator configured to generate a first plasma from the first processing gas in the chamber and a second plasma from the second processing gas in the chamber; and
a controller,
wherein the controller is configured to execute a process including:
  (a) providing the substrate including a first region containing silicon and nitrogen and a second region containing silicon and oxygen;
  (b) forming a tungsten-containing deposit on the first region using a first plasma generated from a first processing gas containing fluorine, tungsten, and at least one selected from a group consisting of carbon and hydrogen; and
  (c) after (b), etching the second region using a second plasma generated from a second processing gas different from the first processing gas.

APPENDIX 14

An etching method comprising:
(a) providing a substrate including a first region containing silicon and nitrogen and a second region containing silicon and oxygen;
(b) forming a carbon-containing deposit on the first region;
(c) forming a tungsten-containing deposit on the carbon-containing deposit using a plasma generated from a processing gas containing fluorine and tungsten; and
(d) after (c), etching the second region.

APPENDIX 15

The etching method according to appendix 14, wherein in (c), an electric power for generating the plasma is applied to a counter electrode facing a substrate support that supports the substrate.

APPENDIX 16

An etching method including:
(a) providing a substrate including a first region having an opening and a second region containing silicon and oxygen below the first region;
(b) forming a tungsten-containing deposit on the first region using a first plasma generated from a first processing gas containing a noble gas, fluorine, and tungsten; and
(c) after (b), etching the second region through the opening using a second plasma generated from a second processing gas different from the first processing gas.

APPENDIX 17

The etching method according to appendix 16, further including:
(d) after (b) and before (c), exposing the tungsten-containing deposit to a third plasma generated from a third processing gas containing a hydrogen-containing gas.

According to an embodiment, an etching method and a plasma processing apparatus capable of forming a tungsten-containing deposit having excellent etching resistance are provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. An etching method comprising:
(a) providing a substrate that is supported by a substrate support and that includes a first region containing silicon and nitrogen and a second region containing silicon and oxygen;
(b) forming a tungsten-containing deposit on the first region using a first plasma generated from a first processing gas containing fluorine, tungsten, and at least one selected from the group consisting of carbon and hydrogen; and
(c) after (b), etching the second region using a second plasma generated from a second processing gas different from the first processing gas;
wherein in (c), a first RF power is periodically applied to an antenna including one or more coils or to a counter electrode facing the substrate support in a first cycle, and a second RF power is periodically applied to the substrate support in the first cycle;
wherein the first cycle includes a first period, a second period, and a third period,
a power value of the second RF power in the first period and the second period is smaller than a power of the second RF power in the third period, and
a power value of the first RF power in the first period is larger than the power of the first RF power in the second period and the third period.

2. The etching method according to claim 1, wherein in (a), the second region is provided to cover the first region, and
the etching method further comprises:
  (d) after (a) and before (b), etching the second region such that the first region is exposed.

3. The etching method according to claim 1, wherein in (b), a temperature of the substrate support that supports the substrate is over 100° C.

4. The etching method according to claim 1, further comprising, in (b) or after (b), sputtering a counter electrode containing silicon and facing the substrate support supporting the substrate.

5. The etching method according to claim 1, wherein a cycle including (b) and (c) is repeated two or more times.

6. The etching method according to claim 1, wherein the first processing gas contains at least one gas selected from the group consisting of argon gas, helium gas, xenon gas, neon gas, and nitrogen gas.

7. The etching method according to claim 1, wherein the second processing gas contains at least one member selected from the group consisting of fluorine and tungsten.

8. The etching method according to claim 1, wherein the substrate is supported by the substrate support,
- in (b), a first bias power is applied to the substrate support, and
- in (c), a second bias power is applied to the substrate support, the second bias power being smaller than the first bias power.

9. The etching method according to claim 1, wherein the substrate is supported by the substrate support, and
- in (b), a bias power is not applied to the substrate support, or the applied bias power is less than 100 W.

10. The etching method according to claim 1, wherein the first region has a recess and the second region is embedded in the recess.

11. The etching method according to claim 10, wherein (c) is performed in a self-aligned contact process.

12. The etching method according to claim 1, wherein the first processing gas contains a tungsten-containing gas and at least one selected from the group consisting of a carbon-containing gas and a hydrogen-containing gas.

13. The etching method according to claim 12, wherein the tungsten-containing gas contains a tungsten hexafluoride gas.

14. The etching method according to claim 12, wherein the carbon-containing gas contains at least one of $CH_4$ gas, $C_2H_2$ gas, $C_2H_4$ gas, $CH_3F$ gas, $CH_2F_2$ gas, $CHF_3$ gas, and CO gas.

15. The etching method according to claim 12, wherein the hydrogen-containing gas contains at least one of $H_2$ gas, $SiH_4$ gas, and $NH_3$ gas.

16. The etching method according to claim 12, wherein in the first processing gas, a flow rate of the tungsten-containing gas is smaller than a flow rate of at least one of the carbon-containing gas and the hydrogen-containing gas.

* * * * *